US010339952B2

(12) United States Patent
Fan

(10) Patent No.: US 10,339,952 B2
(45) Date of Patent: *Jul. 2, 2019

(54) APPARATUSES AND SYSTEMS FOR ACOUSTIC CHANNEL AUTO-BALANCING DURING MULTI-CHANNEL SIGNAL EXTRACTION

(71) Applicant: KOPIN CORPORATION, Westborough, MA (US)

(72) Inventor: Dashen Fan, Bellevue, WA (US)

(73) Assignee: KOPIN CORPORATION, Westborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/784,102

(22) Filed: Oct. 14, 2017

(65) Prior Publication Data

US 2018/0040334 A1     Feb. 8, 2018

Related U.S. Application Data

(63) Continuation of application No. 14/977,534, filed on Dec. 21, 2015, now Pat. No. 9,792,927, which is a (Continued)

(51) Int. Cl.
*G10L 13/02* (2013.01)
*G10L 15/20* (2006.01)
(Continued)

(52) U.S. Cl.
CPC ........ *G10L 21/0232* (2013.01); *G10K 11/002* (2013.01); *G10L 25/84* (2013.01);
(Continued)

(58) Field of Classification Search
USPC ........................................ 704/2–8, 200–274
See application file for complete search history.

(56) References Cited

U.S. PATENT DOCUMENTS 3,378,649 A    4/1968   Mawby
3,789,163 A    1/1974   Dunlavy
(Continued)

FOREIGN PATENT DOCUMENTS

CN      202 102 188      1/2012
EP      2 323 422 A1      5/2011
(Continued)

OTHER PUBLICATIONS

Internation Search Report & Written Opinion for PCT/US2014/026332, Entitled "Dual Stage Noise Reduction Architecture for Desired Signal Extraction," dated Jul. 24, 2014.
(Continued)

*Primary Examiner* — Marcellus J Augustin
(74) *Attorney, Agent, or Firm* — Peloquin, PLLC; Mark S. Peloquin, Esq.

(57) ABSTRACT

Systems and apparatuses are described to automatically balance acoustic channel sensitivity. A computer readable medium containing executable computer program instructions, which when executed by an acoustic signal processing system, cause the acoustic signal processing system to perform a process that includes calculating a long-term power level of a main acoustic signal to obtain an averaged main acoustic signal. Segments of the main acoustic signal are excluded from the averaged main acoustic signal using a desired voice activity detection signal. A long-term power level of a reference acoustic signal is calculated to obtain an averaged reference acoustic signal. Segments of the reference acoustic signal are excluded from the averaged reference acoustic signal using the desired voice activity detection signal. An amplitude correction signal is created using the averaged main acoustic signal and the averaged reference acoustic signal. The amplitude correction signal is used to adjust either the main acoustic signal or the reference
(Continued)

acoustic signal to automatically balance acoustic channel sensitivity.

30 Claims, 20 Drawing Sheets

Related U.S. Application Data continuation of application No. 14/207,212, filed on Mar. 12, 2014, now Pat. No. 9,257,952.

(60) Provisional application No. 61/780,108, filed on Mar. 13, 2013, provisional application No. 61/941,088, filed on Feb. 18, 2014.

(51) Int. Cl.

| | |
|---|---|
| *G10L 21/02* | (2013.01) |
| *G01N 29/44* | (2006.01) |
| *G10L 21/0232* | (2013.01) |
| *H03G 3/00* | (2006.01) |
| *H04R 3/00* | (2006.01) |
| *G10L 25/84* | (2013.01) |
| *H03G 7/00* | (2006.01) |
| *G10K 11/00* | (2006.01) |
| *G10L 21/0216* | (2013.01) |
| *G10L 25/78* | (2013.01) |

(52) U.S. Cl.
CPC ............ *H03G 3/00* (2013.01); *H03G 7/002* (2013.01); *H03G 7/007* (2013.01); *H04R 3/005* (2013.01); *G10K 2210/3015* (2013.01); *G10K 2210/3028* (2013.01); *G10L 21/02* (2013.01); *G10L 2021/02166* (2013.01); *G10L 2025/783* (2013.01); *H04R 2410/05* (2013.01); *H04R 2460/01* (2013.01)

(56) References Cited

U.S. PATENT DOCUMENTS

| | | | |
|---|---|---|---|
| 3,919,481 A | 11/1975 | Kalfaian | |
| 3,946,168 A | 3/1976 | Preves | |
| 4,773,095 A | 9/1988 | Zwicker et al. | |
| 4,904,078 A | 2/1990 | Gorike | |
| 4,966,252 A | 10/1990 | Drever | |
| 5,825,898 A | 10/1998 | Marash | |
| 6,091,546 A | 7/2000 | Spitzer | |
| 6,266,422 B1 | 7/2001 | Ikeda | |
| 6,349,001 B1 | 2/2002 | Spitzer | |
| 6,678,657 B1 | 1/2004 | Bruckner | |
| 6,707,910 B1 | 3/2004 | Valve | |
| 7,174,022 B1 | 2/2007 | Zhang et al. | |
| 7,359,504 B1 | 4/2008 | Reuss et al. | |
| 7,929,714 B2 | 4/2011 | Bazarjani et al. | |
| 8,184,983 B1 | 5/2012 | Ho et al. | |
| 8,543,061 B2 | 9/2013 | Suhami | |
| 8,744,113 B1 | 6/2014 | Rickards | |
| 8,958,572 B1 | 2/2015 | Solbach | |
| 9,280,982 B1 | 3/2016 | Kushner | |
| 2002/0106091 A1 | 8/2002 | Furst | |
| 2003/0040908 A1 | 2/2003 | Yang | |
| 2003/0147538 A1 | 8/2003 | Elko | |
| 2003/0179888 A1 | 9/2003 | Burnett | |
| 2004/0111258 A1 | 6/2004 | Zangi | |
| 2005/0063552 A1* | 3/2005 | Shuttleworth | H03G 3/32 381/57 |
| 2005/0069156 A1 | 3/2005 | Haapapuro et al. | |
| 2005/0096899 A1 | 5/2005 | Padhi | |
| 2005/0248717 A1 | 11/2005 | Howell et al. | |
| 2006/0285714 A1 | 12/2006 | Akino | |
| 2007/0160254 A1 | 7/2007 | Ritter et al. | |
| 2008/0137874 A1 | 6/2008 | Christoph | |
| 2008/0260189 A1 | 10/2008 | Schobben | |
| 2008/0267427 A1 | 10/2008 | Johnston | |
| 2008/0317259 A1 | 12/2008 | Zhang et al. | |
| 2008/0317260 A1 | 12/2008 | Short | |
| 2009/0089053 A1 | 4/2009 | Wang | |
| 2009/0089054 A1 | 4/2009 | Wang | |
| 2009/0112579 A1 | 4/2009 | Li | |
| 2009/0129582 A1 | 5/2009 | Chandran | |
| 2009/0154726 A1 | 6/2009 | Taenzer | |
| 2009/0190774 A1 | 7/2009 | Wang | |
| 2009/0299739 A1 | 12/2009 | Chan | |
| 2010/0100386 A1 | 4/2010 | Yu | |
| 2010/0198590 A1* | 8/2010 | Tackin | G10L 25/90 704/214 |
| 2010/0208928 A1 | 8/2010 | Chene et al. | |
| 2010/0241426 A1 | 9/2010 | Zhang | |
| 2010/0278352 A1 | 11/2010 | Petit | |
| 2010/0280824 A1 | 11/2010 | Petit | |
| 2011/0038489 A1 | 2/2011 | Visser | |
| 2011/0071825 A1 | 3/2011 | Emori | |
| 2011/0081026 A1 | 4/2011 | Ramakrishnan | |
| 2011/0091057 A1 | 4/2011 | Derkx | |
| 2011/0099010 A1 | 4/2011 | Zhang | |
| 2011/0106533 A1 | 5/2011 | Yu | |
| 2011/0137644 A1* | 6/2011 | Nilsson | H04M 3/40 704/205 |
| 2011/0243349 A1 | 10/2011 | Zavarehei | |
| 2011/0293103 A1 | 12/2011 | Park | |
| 2012/0010881 A1 | 1/2012 | Avendano | |
| 2012/0051548 A1 | 3/2012 | Visser | |
| 2012/0075168 A1 | 3/2012 | Osterhout et al. | |
| 2012/0084084 A1 | 4/2012 | Zhu | |
| 2012/0123773 A1 | 5/2012 | Zeng | |
| 2012/0123775 A1 | 5/2012 | Murgia | |
| 2012/0162259 A1 | 6/2012 | Sakai | |
| 2012/0209601 A1 | 8/2012 | Jing | |
| 2012/0215519 A1 | 8/2012 | Park | |
| 2012/0239394 A1 | 9/2012 | Matsumoto | |
| 2012/0259631 A1 | 10/2012 | Lloyd | |
| 2012/0265526 A1* | 10/2012 | Yeldener | G10L 25/84 704/233 |
| 2012/0282976 A1 | 11/2012 | Suhami | |
| 2013/0030803 A1 | 1/2013 | Liao | |
| 2013/0142343 A1 | 6/2013 | Matsui | |
| 2013/0034243 A1 | 7/2013 | Yermeche | |
| 2013/0314280 A1 | 11/2013 | Maltsev et al. | |
| 2013/0332157 A1 | 12/2013 | Iyengar | |
| 2014/0003622 A1 | 1/2014 | Ikizyan | |
| 2014/0006019 A1 | 1/2014 | Paajanen | |
| 2014/0010373 A1* | 1/2014 | Gran | H04R 25/50 381/23.1 |
| 2014/0056435 A1 | 2/2014 | Kjems | |
| 2014/0081631 A1 | 3/2014 | Zhu | |
| 2014/0236590 A1 | 8/2014 | Hu | |
| 2014/0268016 A1 | 9/2014 | Chow et al. | |
| 2014/0270244 A1 | 9/2014 | Fan | |
| 2014/0270316 A1 | 9/2014 | Fan | |
| 2014/0278391 A1 | 9/2014 | Braho | |
| 2014/0337021 A1 | 11/2014 | Kim | |
| 2014/0358526 A1 | 12/2014 | Abdelal | |
| 2015/0012269 A1 | 1/2015 | Nakadai | |
| 2015/0032451 A1 | 1/2015 | Gunn | |
| 2015/0106088 A1 | 4/2015 | Jarvinen | |
| 2015/0172807 A1 | 6/2015 | Olsson | |
| 2015/0215700 A1 | 7/2015 | Sun | |
| 2015/0230023 A1 | 8/2015 | Fujieda | |
| 2015/0262590 A1 | 9/2015 | Joder | |
| 2015/0262591 A1 | 9/2015 | Hill | |
| 2015/0269954 A1 | 9/2015 | Ryan | |
| 2015/0287406 A1 | 10/2015 | Kristjansson | |
| 2015/0294674 A1 | 10/2015 | Takahashi | |
| 2015/0318902 A1 | 11/2015 | Sugiyama | |

(56) References Cited

U.S. PATENT DOCUMENTS

2016/0005422 A1 1/2016 Zad Issa
2016/0029121 A1 1/2016 Nesta

FOREIGN PATENT DOCUMENTS

| EP | 2 469 323 A1 | 6/2012 |
|---|---|---|
| JP | 58013008 A | 1/1983 |
| JP | 06-338827 A | 12/1994 |
| JP | 06338827 A | 12/1994 |
| JP | 9252340 | 9/1997 |
| JP | 10-301600 A | 11/1998 |
| JP | 10301600 A | 11/1998 |
| JP | 2003-271191 A | 9/2003 |
| JP | 2011015018 A | 1/2011 |
| KR | 10-0857822 B1 | 9/2008 |
| KR | 10-0936772 B1 | 1/2010 |
| WO | WO 2000/02419 | 1/2000 |
| WO | WO 2009/076016 | 6/2009 |
| WO | WO 2011/087770 A2 | 7/2011 |
| WO | WO 2012/040386 | 3/2012 |
| WO | WO 2012/097014 A1 | 7/2012 |
| WO | WO 2014/158426 A1 | 10/2014 |
| WO | WO 2014/163794 A2 | 10/2014 |
| WO | WO 2014/163796 A1 | 10/2014 |
| WO | WO 2014/163797 A1 | 10/2014 |

OTHER PUBLICATIONS

Internation Search Report & Written Opinion for PCT/US2014/026605, Entitled "Apparatuses and Methods for Multi-Channel Signal Compression During Desired . . . ," dated Jul. 24, 2014.

International Search Report & Written Opinion for PCT/US2014/026332, Entitled "Apparatuses and Methods for Acoustic Channel Auto-Balancing During Multi- . . . ," dated Jul. 30, 2014.

Zhang, Xianxian, Noise Estimation Based on an Adaptive Smoothing Factor for Improving Speech Quality in a Dual-Microphone Noise Suppression System, 2011, IEEE, 5 Pgs, US.

Internation Search Report & Written Opinion, PCT/US2014/016547, Entitled, "Sound Induction Ear Speaker for Eye Glasses," Apr. 29, 2015 (15 pages).

Internation Search Report & Written Opinion, PCT/US2014/016557, Entitled, "Sound Induction Ear Speaker for Eye Glasses," Sep. 24, 2014 (15 pages).

Internation Search Report & Written Opinion, PCT/US2014/016558, Entitled, "Eye Glasses with Microphone Array", Jun. 12, 2014 (12 pages).

Internation Search Report & Written Opinion, PCT/US2014/016570, Entitled, "Noise Cancelling Microphone Apparatus," Jun. 25, 2014 (19 pages).

\* cited by examiner

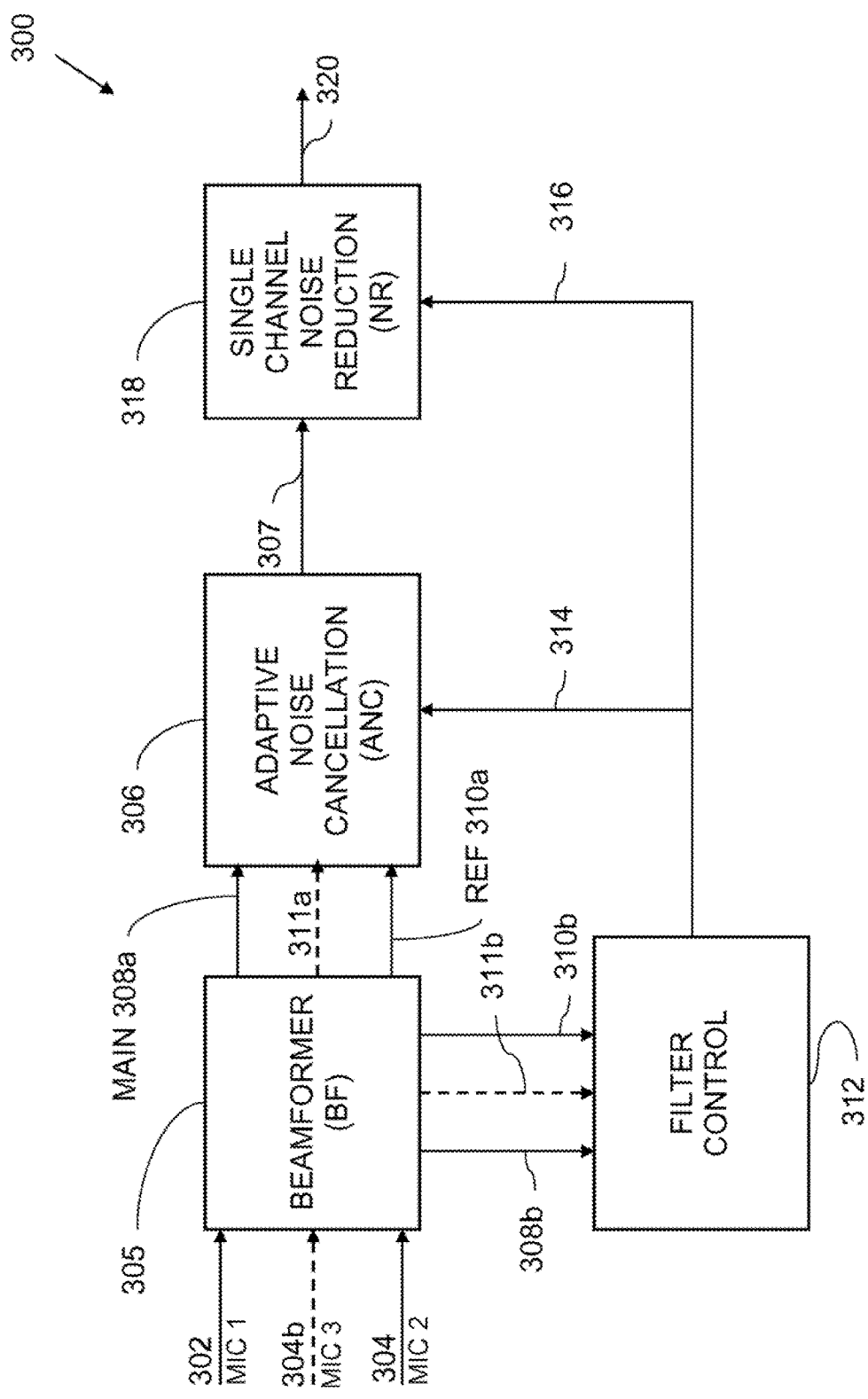

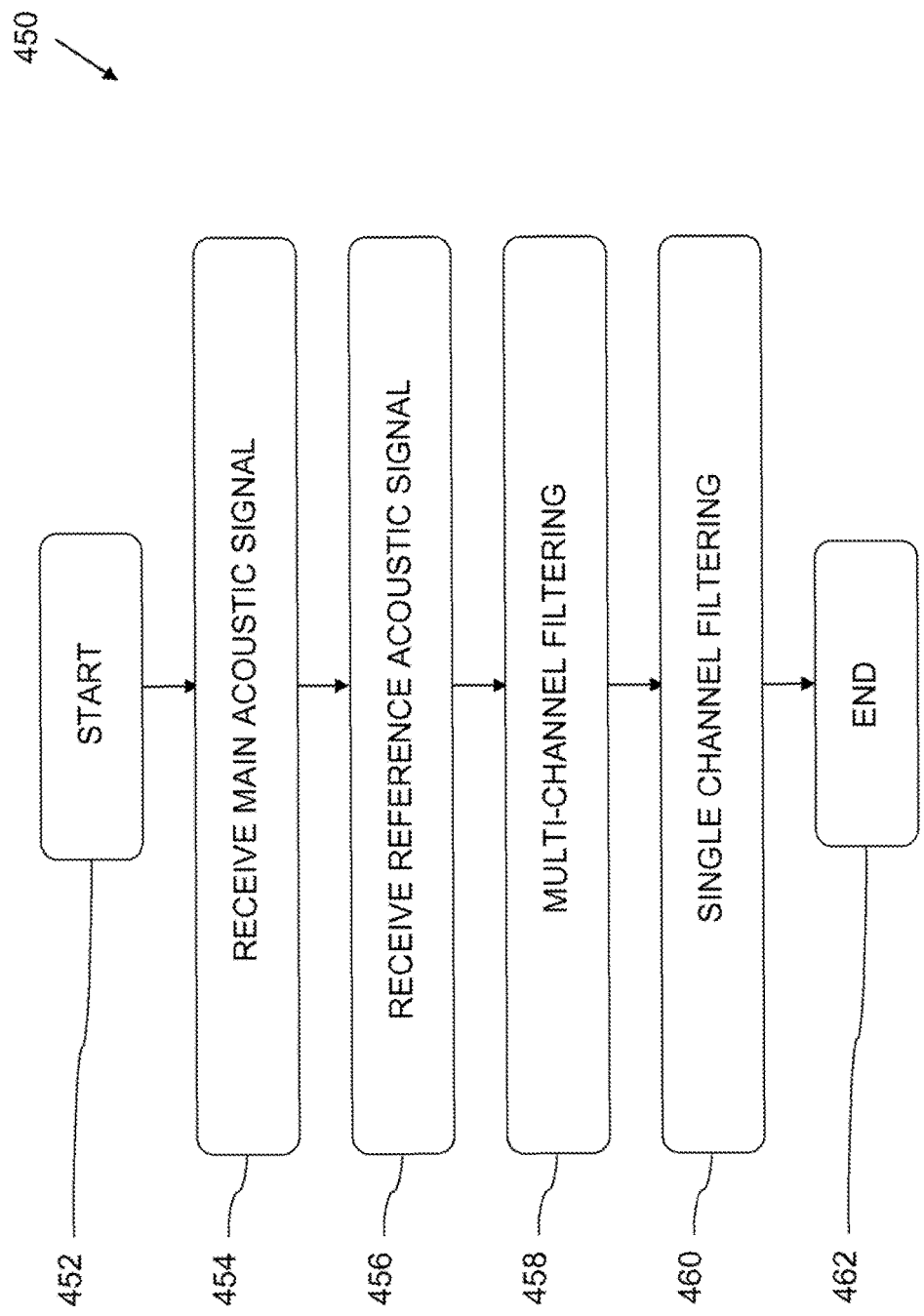

FIGURE 8E

| 895a | 895b | 895c | 895d | 895e |
|---|---|---|---|---|
| X | Y=X | Y=Log$_{10}$(X) | Y=ln(X) | Y=Log$_2$(X) |
| 0.01 | 0.01 | -2 | -4.60 | -6.64 |
| 0.10 | 0.10 | -1 | -2.30 | -3.32 |
| 1.00 | 1.00 | 0 | 0 | 0 |
| 10.00 | 10.00 | 1 | 2.30 | 3.32 |
| 100.0 | 100.0 | 2 | 4.60 | 6.64 |
| 1000.0 | 1000.0 | 3 | 6.90 | 9.96 |

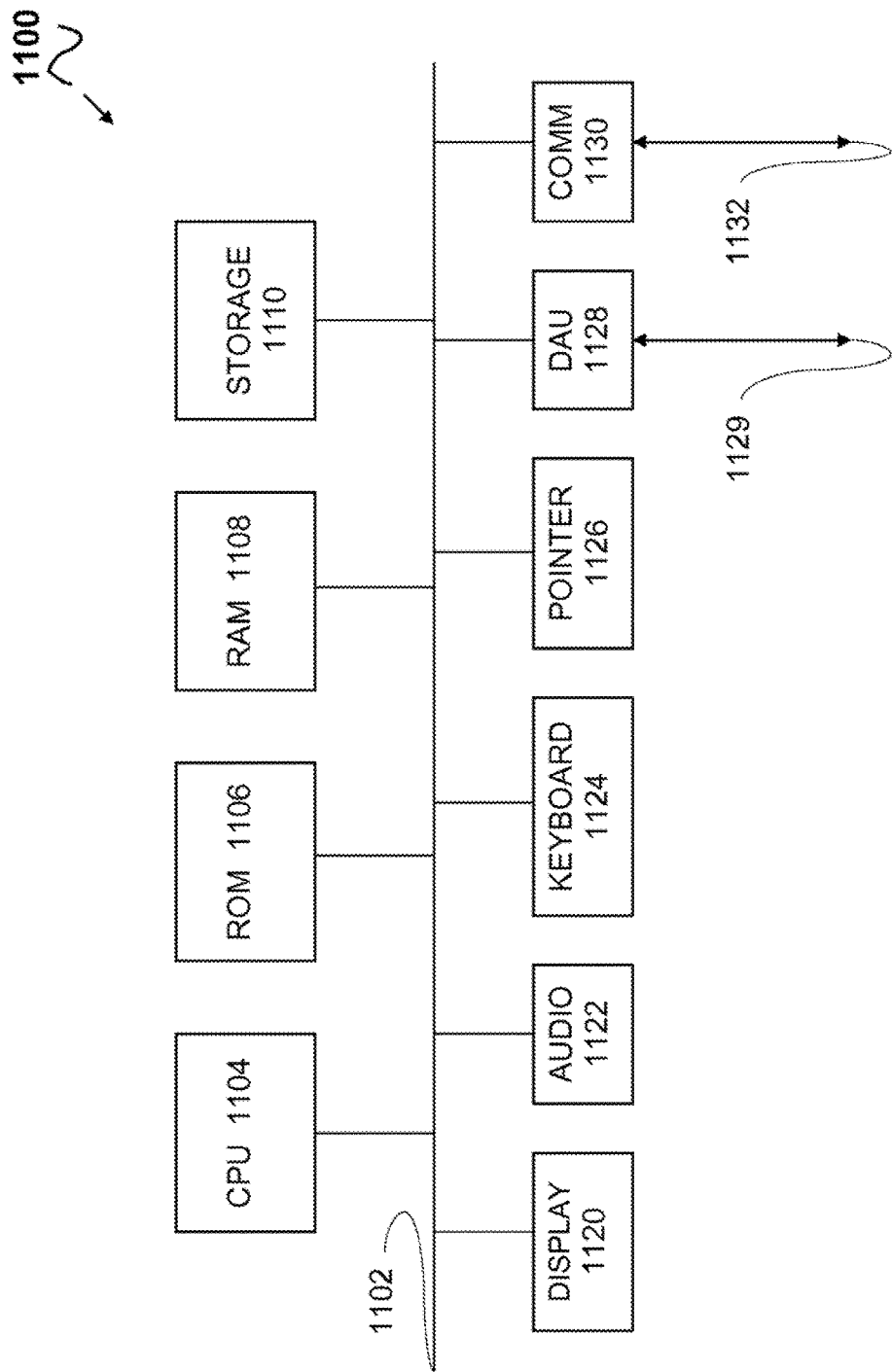

APPARATUSES AND SYSTEMS FOR ACOUSTIC CHANNEL AUTO-BALANCING DURING MULTI-CHANNEL SIGNAL EXTRACTION

RELATED APPLICATIONS

This patent application is a continuation of Patent Application titled "Apparatuses and Methods for Multi-Channel Signal Compression During Desired Voice Activity Detection," filed on Dec. 21, 2015. Ser. No. 14/977,534, now U.S. Pat. No. 9,792,927, which is a continuation of Patent Application titled "Apparatuses and Methods for Multi-Channel Signal Compression During Desired Voice Activity Detection," filed on Mar. 12, 2014, Ser. No. 14/207,212, now U.S. Pat. No. 9,257,952.

This patent application claims priority from U.S. Provisional Patent Application titled "Noise Canceling Microphone Apparatus," filed on Mar. 13, 2013. Ser. No. 61/780,108. This patent application claims priority from U.S. Provisional Patent Application titled "Systems and Methods for Processing Acoustic Signals," filed on Feb. 18, 2014. Ser. No. 61/941,088.

U.S. Non-provisional patent application Ser. No. 14/977,534 is hereby incorporated by reference. U.S. Non-provisional patent application Ser. No. 14/207,212 is hereby incorporated by reference. U.S. Provisional Patent Application Ser. No. 61/780,108 is hereby incorporated by reference. U.S. Provisional Patent Application Ser. No. 61/941,088 is hereby incorporated by reference.

BACKGROUND OF THE INVENTION

1. Field of Invention

The invention relates generally to detecting and processing acoustic signal data and more specifically to reducing noise in acoustic systems.

2. Art Background

Acoustic systems employ acoustic sensors such as microphones to receive audio signals. Often, these systems are used, in real world environments which present desired audio and undesired audio (also referred to as noise) to a receiving microphone simultaneously. Such receiving microphones are part of a variety of systems such as a mobile phone, a handheld microphone, a hearing aid, etc. These systems often perform speech recognition processing on the received acoustic signals. Simultaneous reception of desired audio and undesired audio have a negative impact on the quality of the desired audio. Degradation of the quality of the desired audio can result in desired audio which is output to a user and is hard for the user to understand. Degraded desired audio used by an algorithm such as in speech recognition (SR) or Automatic Speech Recognition (ASR) can result in an increased error rate which can render the reconstructed speech hard to understand. Either of which presents a problem.

Undesired audio (noise) can originate from a variety of sources, which are not the source of the desired audio. Thus, the sources of undesired audio are statistically uncorrelated with the desired audio. The sources can be of a non-stationary origin or from a stationary origin. Stationary applies to time and space where amplitude, frequency, and direction of an acoustic signal do not vary appreciably. For, example, in an automobile environment engine noise at constant speed is stationary as is road noise or wind noise, etc. In the case of a non-stationary signal, noise amplitude, frequency distribution, and direction of the acoustic signal vary as a function of time and or space. Non-stationary noise originates for example, from a ear stereo, noise from a transient such as a bump, door opening or closing, conversation in the background such as chit chat in a back seat of a vehicle, etc. Stationary and non-stationary sources of undesired audio exist in office environments, concert halls, football stadiums, airplane cabins, everywhere that a user will go with an acoustic system (e.g., mobile phone, tablet computer etc. equipped with a microphone, a headset, an ear bud microphone, etc.) At times the environment the acoustic system is used in is reverberant, thereby causing the noise to reverberate, within the environment, with multiple paths of undesired audio arriving at the microphone location. Either source of noise, i.e., non-stationary or stationary undesired audio, increases the error rate of speech recognition algorithms such as SR or ASR or can simply make it difficult for a system to output desired audio to a user which can be understood. All of this can present a problem.

Various noise cancellation approaches have been employed to reduce noise from stationary and non-stationary sources. Existing noise cancellation approaches work better in environments where the magnitude of the noise is less than the magnitude of the desired audio, e.g., in relatively low noise environments. Spectral subtraction is used to reduce noise in speech recognition algorithms and in various acoustic systems such as in hearing aids. Systems employing Spectral Subtraction do not produce acceptable error rates when used in Automatic Speech Recognition (ASR) applications when a magnitude of the undesired audio becomes large. This can present a problem.

In addition, existing algorithms, such as Special Subtraction, etc., employ non-linear treatment of an acoustic signal. Non-linear treatment of an acoustic signal results in an output that is not proportionally related to the input. Speech Recognition (SR) algorithms are developed using, voice signals recorded in a quiet environment without noise. Thus, speech recognition algorithms (developed in a quiet environment without noise) produce a high error rate when non-linear distortion is introduced in the speech process through non-linear signal processing. Non-linear treatment of acoustic signals can result in non-linear distortion of the desired audio which disrupts feature extraction which is necessary for speech recognition, this results in a high error rate. All of which can present a problem.

Various methods have been used to try to suppress or remove undesired audio from acoustic systems, such as in Speech Recognition (SR) or Automatic Speech Recognition (ASR) applications for example. One approach is known as a Voice Activity Detector (VAD). A VAD attempts to detect when desired speech is present and when undesired speech is present. Thereby, only accepting desired speech and treating as noise by not transmitting the undesired speech. Traditional, voice activity detection only works well for a single sound source or a stationary noise (undesired audio) whose magnitude is small relative to the magnitude of the desired audio. Therefore, traditional voice activity detection renders a VAD a poor performer hi a noisy environment. Additionally, using a VAD to remove undesired audio does not work well when the desired audio and the undesired audio are arriving simultaneously at a receive microphone. This can present a problem.

Acoustic systems used in noisy environments with a single microphone present a problem in that desired audio and undesired audio are received simultaneously on a single channel. Undesired audio can make the desired audio unintelligible to either a human user or to an algorithm designed to use received speech such as a Speech Recognition (SR) or an Automatic Speech Recognition (ASR) algorithm. This can present a problem. Multiple channels have been employed to address the problem of the simultaneous reception of desired and undesired audio. Thus, on one channel, desired audio and undesired audio are received and on the other channel an acoustic signal is received which also contains undesired audio and desired audio. Over time the sensitivity of the individual channels can drift which results in the undesired audio becoming unbalanced between the channels. Drifting channel sensitivities can lead to inaccurate removal of undesired audio from desired audio. Non-linear distortion of the original desired audio signal can result from processing acoustic signals obtained from channels whose sensitivities drift over time. This can present a problem.

BRIEF DESCRIPTION OF THE DRAWINGS

The invention may best be understood by referring to the following description and accompanying drawings that are used to illustrate embodiments of the Invention. The invention is illustrated by way of example in the embodiments and is not limited in the figures of the accompanying drawings, in which like references indicate similar elements.

FIG. 3 illustrates another diagram of system architecture, according to embodiments of the invention.

FIG. 4B illustrates processes for noise reduction, according to embodiments of the invention.

FIG. 8E illustrates different functions to provide compression according to embodiments of the invention.

FIG. 11 illustrates an acoustic signal processing system according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses and methods are described for detecting and processing acoustic signals containing both desired audio and undesired audio. In one or more embodiments, noise cancellation architectures combine multi-channel noise cancellation and single channel noise cancellation to extract desired audio from undesired audio. In one or more embodiments, multi-channel acoustic signal compression is used for desired voice activity detection. In one or more embodiments, acoustic channels are auto-balanced.

Figure 1:
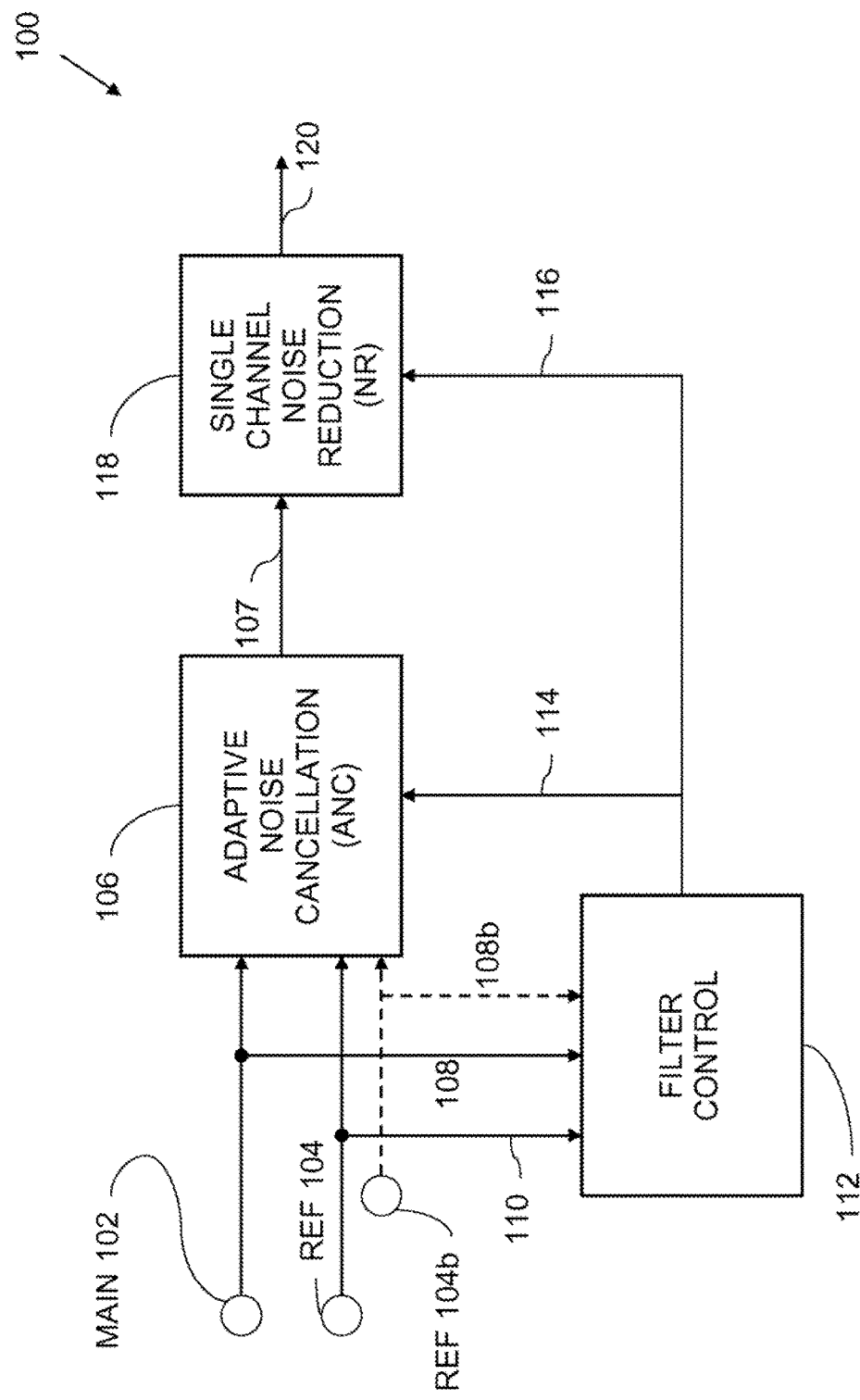
FIG. 1 illustrates system architecture, according to embodiments of the invention.

FIG. 1 illustrates, generally at 100, system architecture, according to embodiments of the invention. With reference to FIG. 1, two acoustic channels are input into an adaptive noise cancellation unit 106. A first acoustic channel, referred to herein as main channel 102 is referred to in this description of embodiments synonymously as a "primary" or a "main" channel. The main channel 102 contains both desired audio and undesired audio. The acoustic signal input on the main channel 102 arises from the presence of both desired audio and undesired audio on one or more acoustic elements as described more fully below in the figures that follow. Depending on the configuration of a microphone or microphones used for the main channel the microphone elements can output an analog signal. The analog signal is converted to a digital signal with an analog-to-digital converter (AD) converter (not shown). Additionally, amplification can be located proximate to the microphone element(s) or AD converter. A second acoustic channel, referred to herein as reference channel 104 provides an acoustic signal which also arises from the presence of desired audio and undesired audio. Optionally, a second reference channel 104b can be input into the adaptive noise cancellation unit 106. Similar to the main channel and depending on the configuration of a microphone or microphones used for the reference channel, the microphone elements can output an analog signal. The analog signal is converted to a digital signal with an analog-to-digital converter (AD) converter (not shown). Additionally, amplification can be located proximate to the microphone element(s) or AD converter.

In some embodiments, the main channel 102 has an omni-directional response and the reference channel 104 has an omni-directional response. In some embodiments, the acoustic beam patterns for the acoustic elements of the main channel 102 and the reference channel 104 are different. In other embodiments, the beam patterns for the main channel 102 and the reference channel 104 are the same; however, desired audio received on the main channel 102 is different from desired audio received on the reference channel 104. Therefore, a signal-to-noise ratio for the main channel 102 and a signal-to-noise ratio for the reference channel 104 are different. In general, the signal-to-noise ratio for the reference channel is less than the signal-to-noise-ratio of the main channel. In various embodiments, by way of non-limiting examples, a difference between a main channel signal-to-noise ratio and a reference channel signal-to-noise ratio is approximately 1 or 2 decibels (dB) or more, in other non-limiting examples, a difference between a main channel signal-to-noise ratio and a reference channel signal-to-noise ratio is 1 decibel (dB) or less. Thus, embodiments of the invention are suited for high noise environments, which can result in low signal-to-noise ratios with respect to desired audio as well as low noise environments, which can have higher signal-to-noise ratios. As used in this description of embodiments, signal-to-noise ratio means the ratio of desired audio to undesired audio in a channel. Furthermore, the term "main channel signal-to-noise ratio" is used interchangeably with the term "main signal-to-noise ratio," Similarly, the term "reference channel signal-to-noise ratio" is used interchangeably with the term "reference signal-to-noise ratio."

The main channel 102, the reference channel 104, and optionally a second reference channel 104b provide inputs to an adaptive noise cancellation unit 106. While a second reference channel is shown in the figures, in various embodiments, more than two reference channels are used. Adaptive noise cancellation unit 106 filters undesired audio from the main channel 102, thereby providing a first stage of filtering with multiple acoustic channels of input. In various embodiments, the adaptive noise cancellation unit 106 utilizes an adaptive finite impulse response (FIR) filter. The environment in which embodiment of the invention are used can present a reverberant acoustic field. Thus, the adaptive noise cancellation unit 106 includes a delay for the main channel sufficient to approximate the impulse response of the environment in which the system is used. A magnitude of the delay used will vary depending on the particular application that a system is designed for including whether or not reverberation must be considered in the design. In some embodiments, for microphone channels positioned very closely together (and where reverberation is not significant) a magnitude of the delay can be on the order of a fraction of a millisecond. Note that at the low end of a range of values, which could be used for a delay, an acoustic travel time between channels can represent a minimum delay value. Thus, in various embodiments, a delay value can range from approximately a fraction of a millisecond to approximately 500 milliseconds or more depending on the application. Further description of the adaptive noise-cancellation unit 106 and the components associated, therewith are provided below in conjunction with the figures that follow.

An output 107 of the adaptive noise cancellation unit 106 is input into a single channel noise cancellation unit 118. The single channel noise cancellation unit 118 filters the output 107 and provides a further reduction of undesired audio from the output 107, thereby providing a second stage of filtering. The single channel noise cancellation unit 118 filters mostly stationary contributions to undesired audio. The single channel noise cancellation unit 118 includes a linear filter, such as for example a WEINER filter, a Minimum Mean Square Error (MMSE) filter implementation, a linear stationary noise filter, or other Bayesian filtering approaches which use prior information about, the parameters to be estimated. Filters used in the single channel noise cancellation unit 118 are described more fully below in conjunction with the figures that follow.

Acoustic signals from the main channel 102 are input at 108 into a filter control 112. Similarly, acoustic signals from the reference channel 104 are input at 110 into the filter control 112. An optional second reference channel is input at 108b into the filter control 112. Filter control 112 provides control signals 114 for the adaptive noise cancellation unit 106 and control signals 116 for the single channel noise cancellation unit 118. In various embodiments, the operation of filter control 112 is described more completely below in conjunction with the figures that follow. An output 120 of the single channel noise cancellation unit 118 provides an acoustic signal which contains mostly desired audio and a reduced amount of undesired audio.

The system architecture shown in FIG. 1 can be used in a variety of different systems used to process acoustic signals according to various embodiments of the invention. Some examples of the different acoustic systems are, but are not limited to a mobile phone, a handheld microphone, a boom microphone, a microphone headset, a hearing aid, a hands free microphone device, a wearable system embedded in a frame of an eyeglass, a near-to-eye (NTE) headset display or headset computing device, etc. The environments that these acoustic systems are used in can have, multiple sources of acoustic energy incident upon the acoustic elements that provide the acoustic signals for the main channel 102 and the reference channel 104. In various embodiments, the desired audio is usually the result of a user's own voice. In various embodiments, the undesired audio is usually the result of the combination of the undesired acoustic energy from the multiple, sources that are incident upon the acoustic elements used for both the main channel and the reference channel. Thus, the undesired audio is statistically uncorrected with the desired audio. In addition, there is a non-causal relationship between the undesired audio in the main channel and the undesired audio in the reference channel. In such a case, echo cancellation does not work because of the non-causal relationship and because there is no measurement of a pure noise signal (undesired audio) apart from the signal of interest (desired audio). In echo cancellation noise reduction systems, a speaker, which generated the acoustic signal, provides a measure of a pure noise signal. In the context of the embodiments of the system described herein, there is no speaker, or noise source from which a pure noise signal could be extracted.

Figure 2:
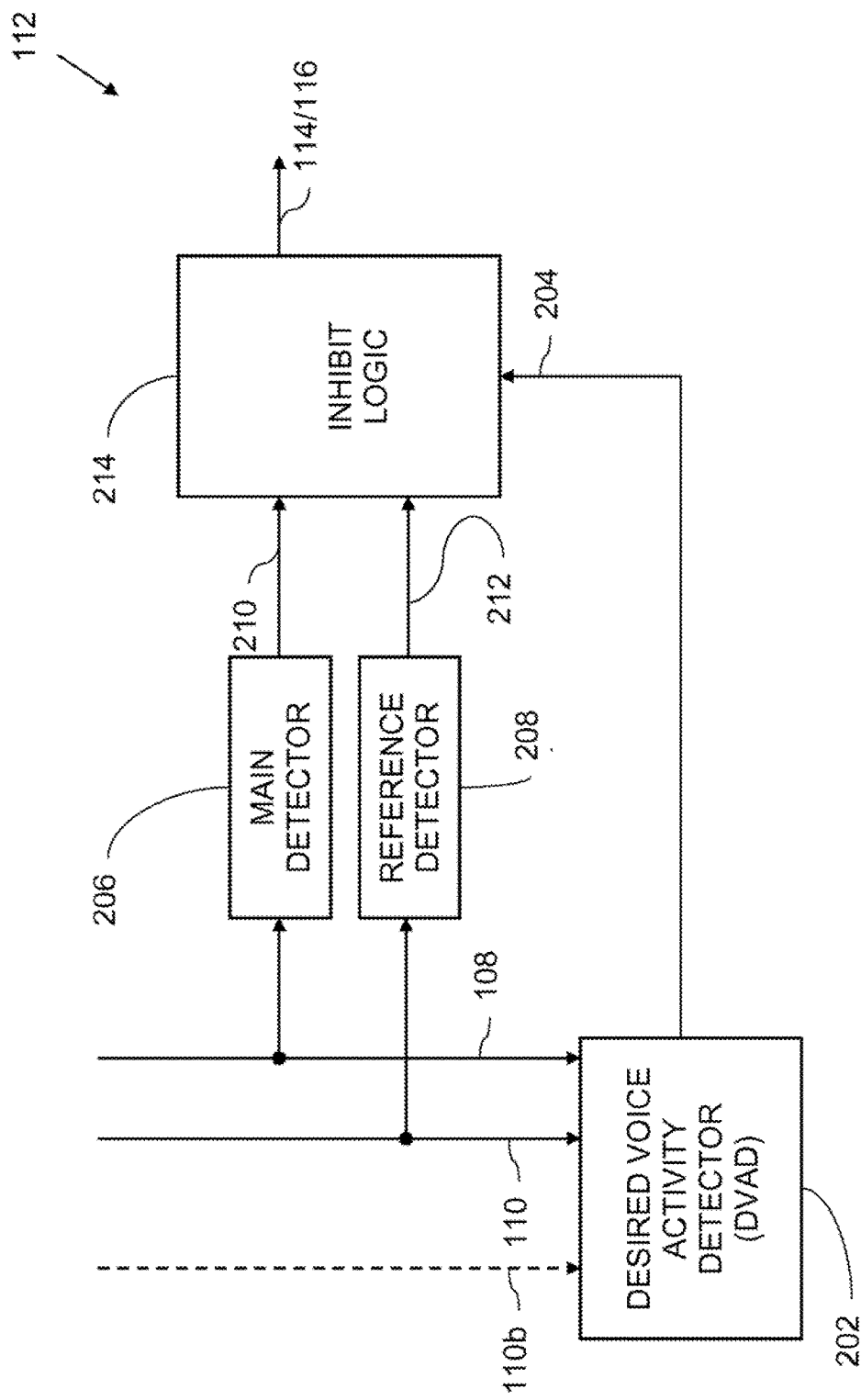
FIG. 2 illustrates filter control according to embodiments of the invention.

FIG. 2 illustrates, generally at 112, filter control, according to embodiments of the invention. With reference to FIG. 2, acoustic signals from the main channel 102 are input at 108 into a desired voice activity detection unit 202. Acoustic signals at 108 are monitored by main channel activity detector 206 to create a flag that is associated with activity on the main channel 102 (FIG. 1). Optionally, acoustic signal at 110b are monitored by a second reference channel activity detector (not shown) to create a flag that is associated with activity on the second reference channel. Optionally, an output of the second reference channel activity detector is coupled to the inhibit control logic 214. Acoustic signals at 110 are monitored by reference channel activity detector 208 to create a flag that is associated with activity on the reference channel 104 (FIG. 1). The desired voice activity detection unit 202 utilizes acoustic signal inputs from 110, 108, and optionally 110b to produce a desired voice activity signal 204. The operation of the desired voice activity detection unit 202 is described more completely below in the figures that follow.

In various embodiments, inhibit logic unit 214 receives as inputs, information regarding main channel activity at 210, reference channel activity at 212, and information pertaining to whether desired audio is present at 204. In various embodiments, the inhibit logic 214 outputs filter control signal 114/116 which is sent to the adaptive noise cancellation unit 106 and the single channel noise cancellation unit 118 of FIG. 1 for example. The implementation and operation of the main channel activity detector 206, the reference channel activity detector 208 and the inhibit logic 214 are described more fully in U.S. Pat. No. 7,386,135 titled "Cardioid Beam With A Desired Null Based Acoustic Devices, Systems and Methods." which is hereby incorporated by reference.

In operation, in various embodiments, the system of FIG. 1 and the filter control of FIG. 2 provide for filtering and removal of undesired audio from the main channel 102 as successive filtering stages are applied by adaptive noise cancellation unit 106 and single channel nose cancellation unit 118. In one or more embodiments, throughout the system, application of the signal processing is applied linearly. In linear signal processing an output is linearly related, to an input. Thus, changing a value of the input, results in a proportional change of the output. Linear application of signal processing processes to the signals preserves the quality and fidelity of the desired audio, thereby substantially eliminating or minimizing any non-linear distortion of the desired audio. Preservation of the signal quality of the desired audio is useful to a user in that accurate reproduction of speech helps to facilitate accurate communication of information.

In addition, algorithms used to process speech, such as Speech Recognition (SR) algorithms or Automatic Speech Recognition (ASR) algorithms benefit from accurate presentation of acoustic signals which are substantially free of non-linear distortion. Thus, the distortions which can arise from the application of signal processing processes which are non-linear are eliminated by embodiments of the invention. The linear noise cancellation algorithms, taught by embodiments of the invention, produce changes to the desired audio winch are transparent to the operation of SR and ASR algorithms employed by speech recognition engines. As such, the error rates of speech recognition engines are greatly reduced through application of embodiments of the invention.

FIG. 3 illustrates, generally at 300, another diagram of system architecture, according to embodiments of the invention. With reference to FIG. 3, in the system architecture presented therein, a first channel provides acoustic signals from a first microphone at 302 (nominally labeled in the figures as MIC 1). A second channel provides acoustic signals from a second microphone at 304 (nominally labeled in the figure as MIC 2). In various embodiments, one or more microphones can be used to create the signal from the first microphone 302. In various embodiments, one or more microphones can be used to create the signal from the second microphone 304. In some embodiments, one or more acoustic elements can be used to create a signal that contributes to the signal from the first microphone 302 and to the signal front the second microphone 304 (see FIG. 5C described below). Thus, an acoustic element can be shared by 302 and 304. In various embodiments, arrangements of acoustic elements which provide the signals at 302, 304, the main channel, and the reference channel are described below in conjunction with the figures that follow.

A beamformer 305 receives as inputs, the signal from the first microphone 302 and the signal from the second microphone 304 and optionally a signal from a third microphone 304b (nominally labeled in the figure as MIC 3). The beamformer 305 uses signals 302, 304 and optionally 304b to create a main channel 308a which contains both desired audio and undesired audio. The beamformer 305 also uses signals 302, 304, and optionally 304b to create one or more reference channels 310a and optionally 311a. A reference channel contains both desired audio and undesired audio. A signal-to-noise ratio of the main channel, referred to as "main channel signal-to-noise ratio" is greater than a signal-to-noise ratio of the reference channel, referred to herein as "reference channel signal-to-noise ratio." The beamformer 305 and/or the arrangement of acoustic elements used for MIC 1 and MIC 2 provide for a main channel signal-to-noise ratio which is greater than the reference channel signal-to-noise ratio.

The beamformer 305 is coupled to an adaptive noise cancellation unit 306 and a filter control unit 312. A main channel signal is output from the beamformer 305 at 308a and is input into an adaptive noise cancellation unit 306. Similarly, a reference channel signal is output from the beamformer 305 at 310a and is input into the adaptive noise cancellation unit 306. The main channel signal is also output from the beamformer 305 and is input into a filter control 312 at 308b. Similarly, the reference channel signal is output from the beamformer 305 and is input into the filter control 312 at 310b. Optionally, a second reference channel signal is output at 311a and is input into the adaptive noise cancellation unit 306 and the optional second, reference channel signal is output at 311b and is input into the filter control 112.

The filter control 312 uses inputs 308b, 310b and optionally 311b to produce channel activity flags and desired voice activity detection to provide filter control signal 314 to the adaptive noise cancellation unit 306 and filter control signal 316 to a single channel noise reduction unit 318.

The adaptive noise cancellation unit 306 provides multi-channel filtering and filters a first amount of undesired audio from the main channel 308a during a first stage of filtering to output a filtered main channel at 307. The single channel noise reduction unit 318 receives as an input the filtered main channel 307 and provides a second stage of filtering, thereby further reducing undesired audio from 307. The single channel noise reduction unit 318 outputs mostly desired audio at 320.

In various embodiments, different types of microphones can be used to provide the acoustic signals needed for the embodiments of the invention presented herein. Any transducer that converts a sound wave to an electrical signal is suitable for use with embodiments of the invention taught herein. Some non-limiting examples of microphones are, but are not limited to, a dynamic microphone, a condenser microphone, an Electret Condenser Microphone, (ECM), and a microelectromechanical systems (MEMS) microphone. In other embodiments a condenser microphone (CM) is used. In yet other embodiments micro-machined microphones are used. Microphones based on a piezoelectric film, are used with other embodiments. Piezoelectric elements are made out of ceramic materials, plastic material, or film. In yet other embodiments, micromachined arrays of microphones are used. In yet other embodiments, silicon or polysilicon micromachined microphones are used. In some embodiments, bi-directional pressure gradient microphones are used to provide multiple acoustic channels. Various microphones or microphone arrays including the systems described herein, can be mounted on or within structures such as eyeglasses or headsets.

Figure 4A:
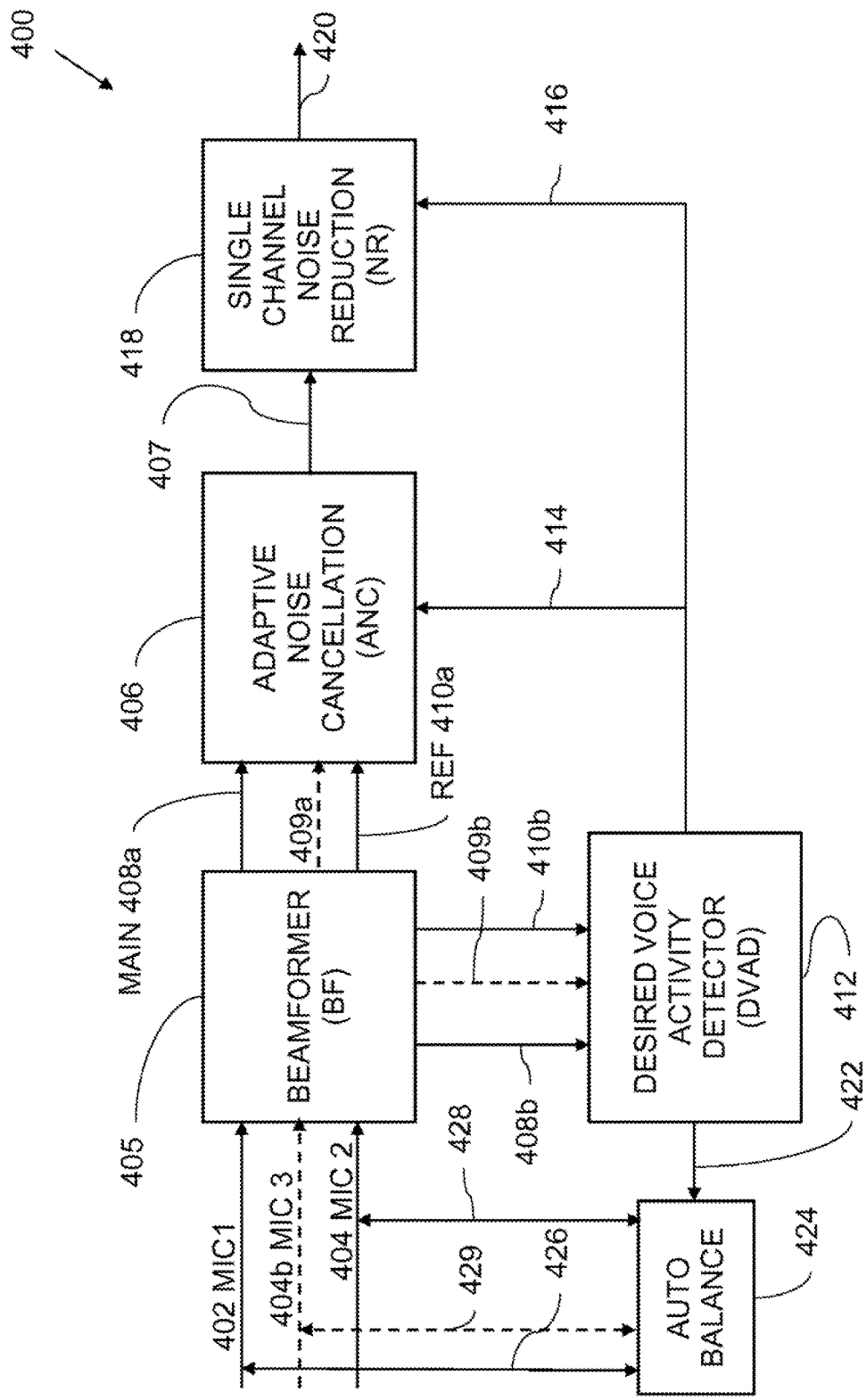
FIG. 4A illustrates another diagram of system architecture incorporating auto-balancing, according to embodiments of the invention.

FIG. 4A illustrates, generally at 400, another diagram of system architecture incorporating auto-balancing, according to embodiments of the invention. With reference to FIG. 4A, in the system architecture presented therein, a first channel provides acoustic signals from a first microphone at 402

(nominally labeled in the FIG. as MIC 1). A second channel provides acoustic signals from a second microphone at 404 (nominally labeled in the figure as MIC 2). In various embodiments, one or more microphones can be used to create the signal from the first microphone 402. In various embodiments, one or more microphones can be used to create the signal from the second microphone 404. In some embodiments, as described above in conjunction with FIG. 3, one or more acoustic elements can be used to create a signal that becomes part of the signal from the first microphone 402 and the signal from the second microphone 404. In various embodiments, arrangements of acoustic elements which provide the signals 402, 404, the main channel, and the reference channel are described below in conjunction with the figures that follow.

A beamformer 405 receives as inputs, the signal from the first microphone 402 and the signal from the second microphone 404. The beamformer 405 uses signals 402 and 404 to create a main channel which contains both desired audio and undesired audio. The beamformer 405 also uses signals 402 and 404 to create a reference channel. Optionally, a third channel provides acoustic signals from a third microphone at 404b (nominally labeled in the figure as MIC 3), which are input into the beamformer 405. In various embodiments, one or more microphones can be used to create the signal 404b from the third microphone. The reference channel contains both desired audio and undesired audio. A signal-to-noise ratio of the main channel, referred to as "main channel signal-to-noise ratio" is greater than a signal-to-noise ratio of the reference channel, referred to herein as "reference channel signal-to-noise ratio." The beamformer 405 and/or the arrangement of acoustic elements used for MIC 1, MIC 2, and optionally MIC 3 provide for a main channel signal-to-noise ratio that is greater than the reference channel signal-to-noise ratio. In some embodiments bi-directional pressure-gradient microphone elements provide the signals 402, 404, and optionally 404b.

The beamformer 405 is coupled to an adaptive noise cancellation unit 406 and a desired voice activity detector 412 (filter control). A main channel signal is output from the beamformer 405 at 408a and is input into an adaptive noise cancellation unit 406. Similarly, a reference channel signal is output from the beamformer 405 at 410a and is input into the adaptive noise cancellation unit 406. The main channel signal is also output from the beamformer 405 and is input into the desired voice activity detector 412 at 408b. Similarly, the reference channel signal is output from the beamformer 405 and is input into the desired voice activity detector 412 at 410b. Optionally, a second reference channel signal is output at 409a from the beam former 405 and is input to the adaptive noise cancellation unit 406, and the second reference channel signal is output at 409b from the beam former 405 and is input to the desired vice activity detector 412.

The desired voice activity detector 412 uses input 408b, 410b, and optionally 409b to produce filter control signal 414 for the adaptive noise cancellation unit 408 and filter control signal 416 for a single channel noise reduction unit 418. The adaptive noise cancellation unit 406 provides multi-channel filtering and filters a first amount of undesired audio from the main channel 408a dining a first stage of filtering to output a filtered main channel at 407. The single channel noise reduction unit 418 receives as an input the filtered main channel 407 and provides a second stage of filtering, thereby further reducing undesired audio from 407. The single channel noise reduction unit 418 outputs mostly desired audio at 420

The desired voice activity detector 412 provides a control signal 422 for an auto-balancing unit 424. The auto-balancing unit 424 is coupled at 426 to the signal path from the first microphone 402. The auto-balancing unit 424 is also coupled at 428 to the signal path from the second microphone 404. Optionally, the auto-balancing unit 424 is also coupled at 429 to the signal path from the third microphone 404b. The auto-balancing unit 424 balances the microphone response to tar field signals over the operating life of the system. Keeping the microphone channels balanced increases the performance of the system and maintains a high level of performance by preventing drift of microphone sensitivities. The auto-balancing unit is described more fully below in conjunction with the figures that follow.

FIG. 4B illustrates, generally at 450, processes for noise reduction, according to embodiments of the invention. With reference to FIG. 4B, a process begins at a block 452. At a block 454 a main acoustic signal is received by a system. The main acoustic signal can be for example, in various embodiments such a signal as is represented by 102 (FIG. 1), 302/308a/308b (FIG. 3), or 402/408a/408b (FIG. 4A). At a block 456 a reference acoustic signal is received by the system. The reference acoustic signal can be for example, in various embodiments such a signal as is represented by 104 and optionally 104b (FIG. 1), 304/310a/310b and optionally 304b/311a/311b (FIG. 3), or 404-410a/410b and optionally 404b/409a/409b (FIG. 4A). At a block 458 adaptive filtering is performed with multiple channels of input, such as using for example the adaptive filter unit 106 (FIG. 1), 306 (FIG. 3), and 406 (FIG. 4A) to provide a filtered acoustic signal for example as shown at 107 (FIG. 1), 307 (FIG. 3), and 407 (FIG. 4A). At a block 460 a single channel unit is used to filter the filtered acoustic signal which results from the process of the block 458. The single channel unit can be for example, in various embodiments, such a unit as is represented by 118 (FIG. 1), 318 (FIG. 3), or 418 (FIG. 4A). The process ends at a block 462.

In various embodiments, the adaptive noise cancellation unit, such as 106 (FIG. 1), 306 (FIG. 3), and 406 (FIG. 4A) is implemented in an. Integrated circuit device, which may include an integrated circuit package containing the integrated circuit in some embodiments, the adaptive noise cancellation unit 106 or 306 or 406 is implemented in a single integrated circuit die, in other embodiments, the adaptive noise cancellation unit 106 or 306 or 406 is implemented in more than one integrated circuit die of an integrated circuit device which may include a multi-chip package containing the integrated circuit.

In various embodiments, the single channel noise cancellation unit, such as 118 (FIG. 1), 318 (FIG. 3), and 418 (FIG. 4A) is implemented in an integrated circuit device, which may include an integrated circuit package containing the integrated circuit. In some embodiments, the single channel noise cancellation unit 118 or 318 or 418 is implemented in a single integrated circuit die. In other embodiments, the single channel noise cancellation unit 118 or 318 or 418 is implemented in more than one integrated circuit die of an integrated circuit device which may include a multi-chip package containing the integrated circuit.

In various embodiments, the filter control, such as 112 (FIGS. 1 & 2) or 312 (FIG. 3) is implemented, in an integrated circuit device, which, may include an integrated circuit package containing the integrated circuit. In some embodiments, the filter control 112 or 312 is implemented in a single integrated circuit die. In other embodiments, the filter control 112 or 312 is implemented in more than one integrated circuit die of an integrated circuit device which may include a multi-chip package containing the integrated circuit.

In various embodiments, the beamformer, such as 305 (FIG. 3) or 405 (FIG. 4A) is implemented in an integrated circuit device, which may include an integrated circuit, package containing the integrated circuit. In some embodiments, the beamformer 305 or 405 is implemented in a single integrated circuit die. In other embodiments, the beamformer 305 or 405 is implemented in more than one integrated circuit die of an integrated circuit device which may include a multi-chip package containing the integrated circuit.

Figure 5A:
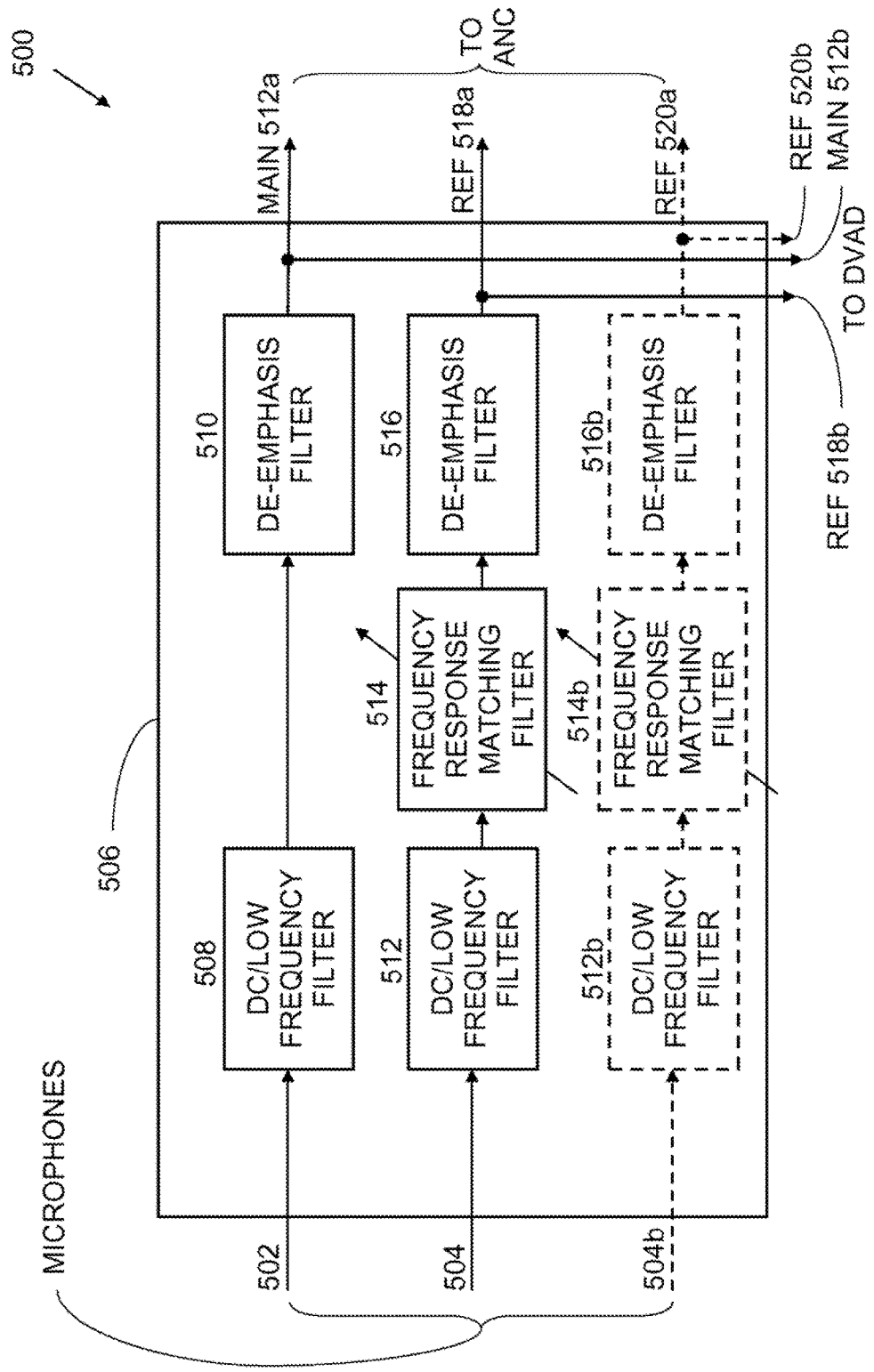
FIG. 5A illustrates beamforming according to embodiments of the invention.

FIG. 5A illustrates, generally at 500, beamforming according to embodiments of the invention. With reference to FIG. 5A, a beamforming block 506 is applied to two microphone inputs 502 and 504. In one or more embodiments, the microphone input 502 can originate from a first directional microphone and the microphone input 504 can originate from a second directional microphone or microphone signals 502 and 504 can originate from omni-directional microphones. In yet other embodiments, microphone signals 502 and 504 are provided by the outputs of a bi-directional pressure gradient microphone. Various directional, microphones can be used, such as but not limited to, microphones having a cardioid beam pattern, a dipole beam pattern, an omni-directional beam pattern, or a user defined beam pattern. In some embodiments, one or more acoustic elements are configured to provide the microphone input 502 and 504.

In various embodiments, beamforming block 506 includes a filter 508. Depending on the type of microphone used and the specific application, the filter 508 can provide a direct current (DC) blocking filter which filters the DC and very low frequency components of Microphone input 502. Following the filter 508, in some embodiments additional filtering is provided by a filter 510. Some microphones have non-flat responses as a function of frequency. In such a case, it can be desirable to flatten the frequency response of the microphone with a de-emphasis filter. The filter 510 can provide de-emphasis, thereby flattening a microphone's frequency response. Following de-emphasis filtering by the filter 510, a main microphone channel is supplied to the adaptive noise cancellation unit at 512a and the desired voice activity detector at 512b.

A microphone input 504 is input into the beamforming block 506 and in some embodiments is filtered by a filter 512. Depending on the type of microphone used and the specific application, the filter 512 can provide a direct current. (DC) blocking filter which filters the DC and very low frequency components of Microphone input 504. A filter 514 filters the acoustic signal which is output from the filter 512. The filter 514 adjusts the gain, phase, and can also shape the frequency response of the acoustic signal. Following the filter 514, in some embodiments additional filtering is provided by a filter 516. Some microphones have non-flat responses as a function of frequency. In such a case, it can be desirable to flatten the frequency response of the microphone with a de-emphasis filter. The filter 516 can provide de-emphasis, thereby flattening a microphone's frequency response. Following de-emphasis filtering by the filter 516, a reference microphone channel is supplied to the adaptive noise cancellation unit at 518a and to the desired voice activity detector at 518b.

Optionally, a third microphone channel is input at 504b into the beamforming block 506. Similar to the signal path described above for the channel 504, the third microphone channel is filtered by a filter 512b. Depending on the type of microphone used and the specific application, the filter 512b can provide a direct current (DC) blocking filter which filters the DC and very low frequency components of Microphone input 504b. A filter 514b filters, the acoustic signal which is output from the filter 512b. The filter 514b adjusts the gain, phase, and can also shape the frequency response of the acoustic signal. Following the filter 514b, in some embodiments additional filtering is provided by a filter 516b. Some microphones have non-flat responses as a function of frequency, in such a case, it can be desirable to flatten the frequency response of the microphone with a de-emphasis filter. The filter 516b can provide de-emphasis, thereby flattening a microphone's frequency response. Following de-emphasis filtering by the filter 516b, a second reference microphone channel is supplied to the adaptive noise cancellation unit at 520a and to the desired voice activity detector at 520b.

Figure 5B:
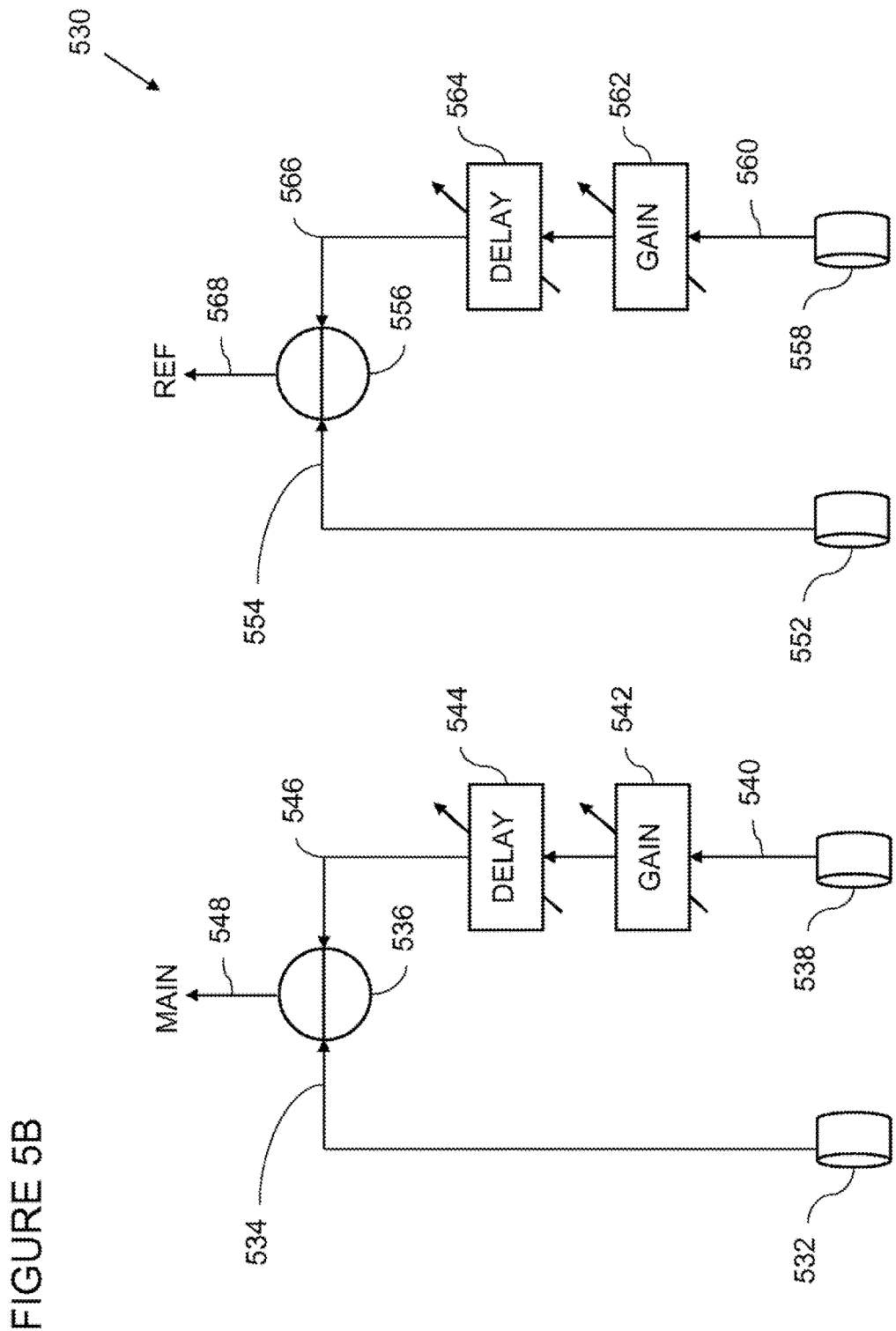
FIG. 5B presents another illustration of beamforming according to embodiments of the invention.

FIG. 5B presents, generally at 530, another illustration of beamforming according to embodiments of the invention. With reference to FIG. 5B, a beam pattern is created for a main channel using a first microphone 532 and a second microphone 538. A signal 534 output from the first microphone 532 is input to an adder 536. A signal 540 output from the second microphone 538 has its amplitude adjusted at a block 542 and its phase adjusted by applying a delay at a block 544 resulting in a signal. 546 which is input to the adder 536. The adder 536 subtracts one signal from the other resulting in output signal 548. Output signal 548 has a beam pattern which can take on a variety of forms depending on the initial beam patterns of microphone 532 and 538 and the gain applied at 542 and the delay applied at 544. By way of non-limiting example, beam patterns can include cardioid, dipole, etc.

A beam pattern is created for a reference channel using a third microphone 552 and a fourth microphone 558. A signal 554 output from the third microphone 552 is input to an adder 556. A signal 560 output from the fourth microphone 558 has its amplitude adjusted at a block 562 and its phase adjusted by applying a delay at a block 564 resulting in a signal 566 which is input to the adder 556. The adder 556 subtracts one signal from the other resulting in output signal 568. Output signal 568 has a beam pattern which can take on a variety of forms depending on the initial beam patterns of microphone 552 and 558 and the gain applied at 562 and the delay applied at 564. By way of non-limiting example, beam patterns can include cardioid, dipole, etc.

Figure 5C:
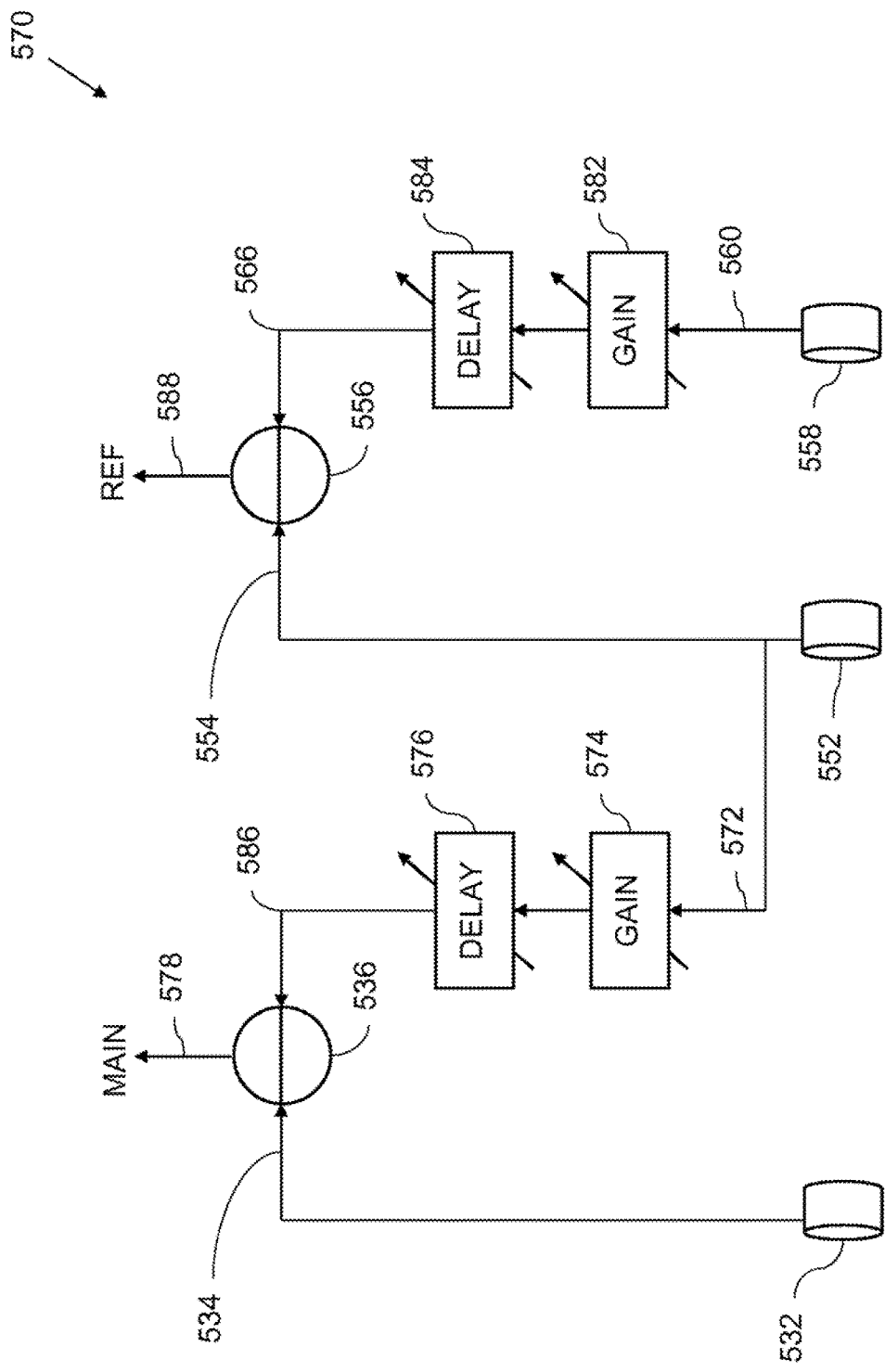
FIG. 5C illustrates beamforming with shared acoustic elements according to embodiments of the invention.

FIG. 5C illustrates, generally at 570, beamforming with shared acoustic elements according to embodiments of the invention. With reference to FIG. 5C, a microphone 552 is shared between the main acoustic channel and the reference acoustic channel. The output from microphone 552 is split and travels at 572 to gain 574 and to delay 576 and is then input at 586 into the adder 536. Appropriate gain at 574 and delay at 576 can be selected to achieve equivalently an output 578 from the adder 536 which is equivalent to the output 548 from adder 536 (FIG. 8B). Similarly gain 582 and delay 584 can be adjusted to provide an output signal 588 which is equivalent to 568 (FIG. 5B). By way of non-limiting example, beam patterns can include cardioid, dipole, etc.

Figure 6:
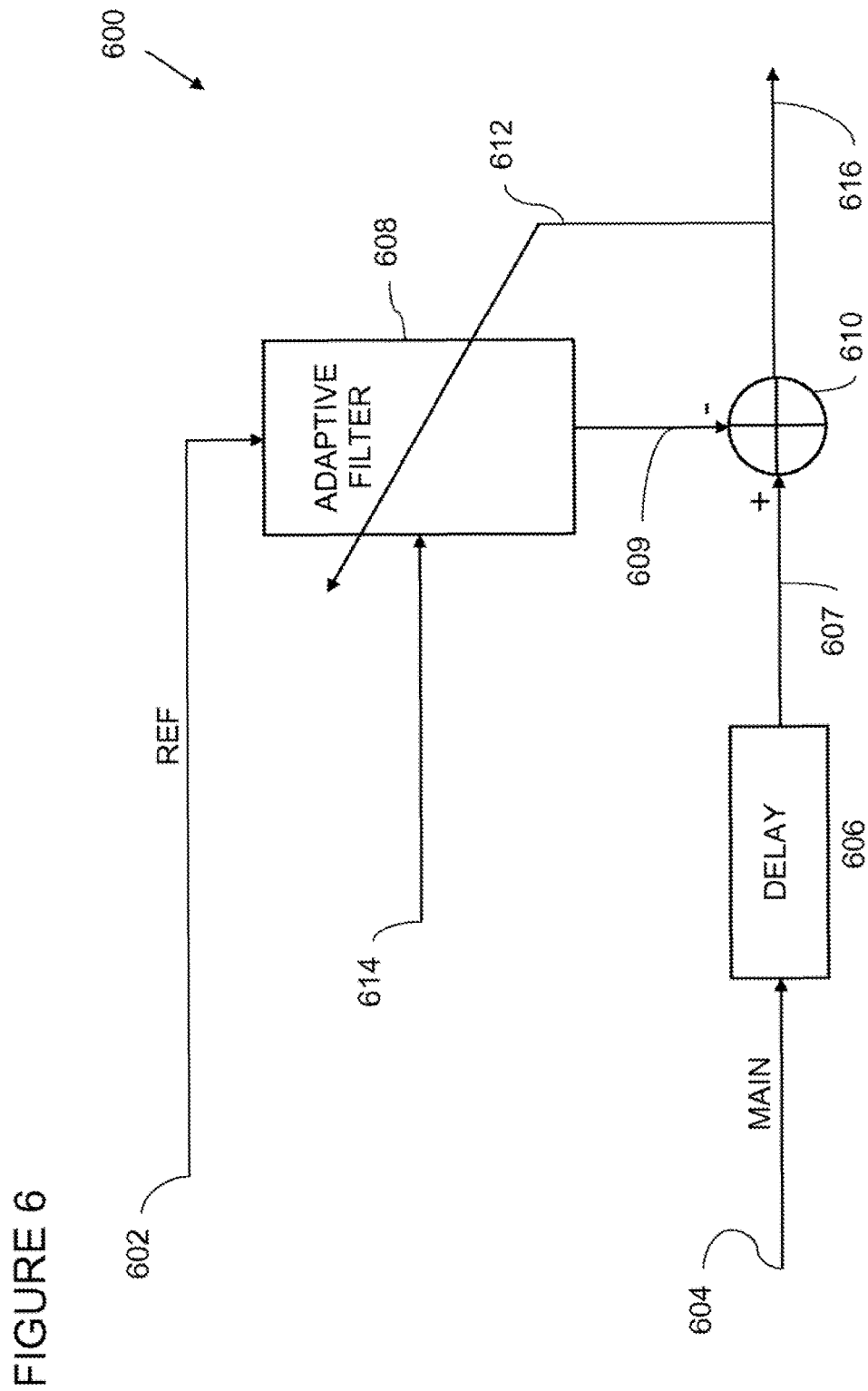
FIG. 6 illustrates multi-channel adaptive filtering according to embodiments of the invention.

FIG. 6 illustrates, generally at 600, multi-channel adaptive filtering according to embodiments of the invention. With reference to FIG. 6, embodiments of an adaptive filter unit are illustrated with a main channel 604 (containing a microphone signal) input into a delay element 600. A reference channel 602 (containing a microphone signal) is input into an adaptive filter 608. In various embodiments, the adaptive filter 608 can be an adaptive FIR filter designed to implement normalized least-mean-square-adaptation (NLMS) or another algorithm. Embodiments of the invention are not limited to NLMS adaptation. The adaptive FIR filter filters an estimate of desired audio from the reference signal 602. In one or more embodiments, an output 609 of the adaptive filter 608 is input into an adder 610. The delayed main channel signal 607 is input into the adder 610 and the output 609 is subtracted from the delayed main channel signal 607. The output of the adder 616 provides a signal containing desired audio with a reduced amount of undesired audio.

Many environments that acoustic systems employing embodiments of the invention are used in present reverberant conditions. Reverberation results in a form of noise and contributes to the undesired audio which is the object of the filtering and signal extraction described herein. In various embodiments, the two channel adaptive FIR filtering represented at 600 models the reverberation between the two channels and the environment they are used in. Thus, undesired audio propagates along the direct path and the reverberant path requiring the adaptive FIR filter to model the impulse response of the environment. Various approximations of the impulse response of the environment can be made depending on the degree of precision needed. In one non-limiting example, the amount of delay is approximately equal to the impulse response time of the environment, in another non-limiting example, the amount of delay is greater than an impulse response of the environment. In one embodiment, an amount of delay is approximately equal to a multiple h of the impulse response time of the environment, where n can equal 2 or 3 or more for example. Alternatively, an amount of delay is not an integer number of impulse response times, such as for example, 0.5, 1.4, 2.75, etc. For example, in one embodiment, the filter length is approximately equal to twice the delay chosen for 606. Therefore, if an adaptive filter having 200 taps is used, the length of the delay 606 would be approximately equal to a time delay of 100 taps. A time delay equivalent to the propagation time through 100 taps is provided merely for illustration and does not imply any form of limitation to embodiments of the invention.

Embodiments of the invention can be used in a variety of environments which have a range of impulse response times. Some examples of impulse response times are given as non-limiting examples for the purpose of illustration only and do not limit embodiments of the invention. For example, an office environment typically has an impulse response time of approximately 100 milliseconds to 200 milliseconds. The interior of a vehicle cabin can provide impulse response times ranging from 30 milliseconds to 60 milliseconds. In general, embodiments of the invention are used in environments whose impulse response times can range from several milliseconds, to 500 milliseconds or more.

The adaptive filter unit 600 is in communication at 614 with inhibit logic such as inhibit logic 214 and filter control signal 114 (FIG. 2). Signals 614 controlled by inhibit logic 214 are used to control the filtering performed by the filter 608 and adaptation of the filter coefficients. An output 616 of the adaptive filter unit 600 is input to a single channel noise cancellation unit such as those-described above in the preceding figures, for example; 118 (FIG. 1), 318 (FIG. 3), and 418 (FIG. 4A). A first level of undesired audio has been extracted from the main acoustic channel resulting in the output 616. Under various operating conditions the level of the noise, i.e., undesired audio can be very large relative to the signal of interest i.e., desired audio. Embodiments of the invention are operable in conditions where some difference in signal-to-noise ratio between the main and reference channels exists. In some embodiments, the differences in signal-to-noise ratio are on the order of 1 decibel (dB) or less. In other embodiments, the differences in signal-to-noise ratio are on the order of 1 decibel (dB) or more. The output 616 is filtered additionally to reduce the amount of undesired audio contained therein in the processes that follow using a single channel noise reduction unit.

Inhibit logic, described in FIG. 2 above including signal 614 (FIG. 6) provide for the substantial non-operation of filter 608 and no adaptation of the filter coefficients when either the main or the reference, channels are determined to be inactive. In such a condition, the signal present on the main channel 604 is output at 616.

If the main channel and the reference channels are active and desired audio is defected or a pause threshold has not been reached then adaptation is disabled, with filter coefficients frozen, and the signal on the reference channel 602 is filtered by the filter 608 subtracted from the main channel 607 with adder 610 and is output at 616.

If the main channel and the reference channel are active and desired audio is not detected and the pause threshold (also called pause time) is exceeded then filter coefficients are adapted. A pause threshold is application dependent. For example, in one non-limiting example, in the case of Automatic Speech Recognition (ASR) the pause threshold can be approximately a fraction of a second.

Figure 7:
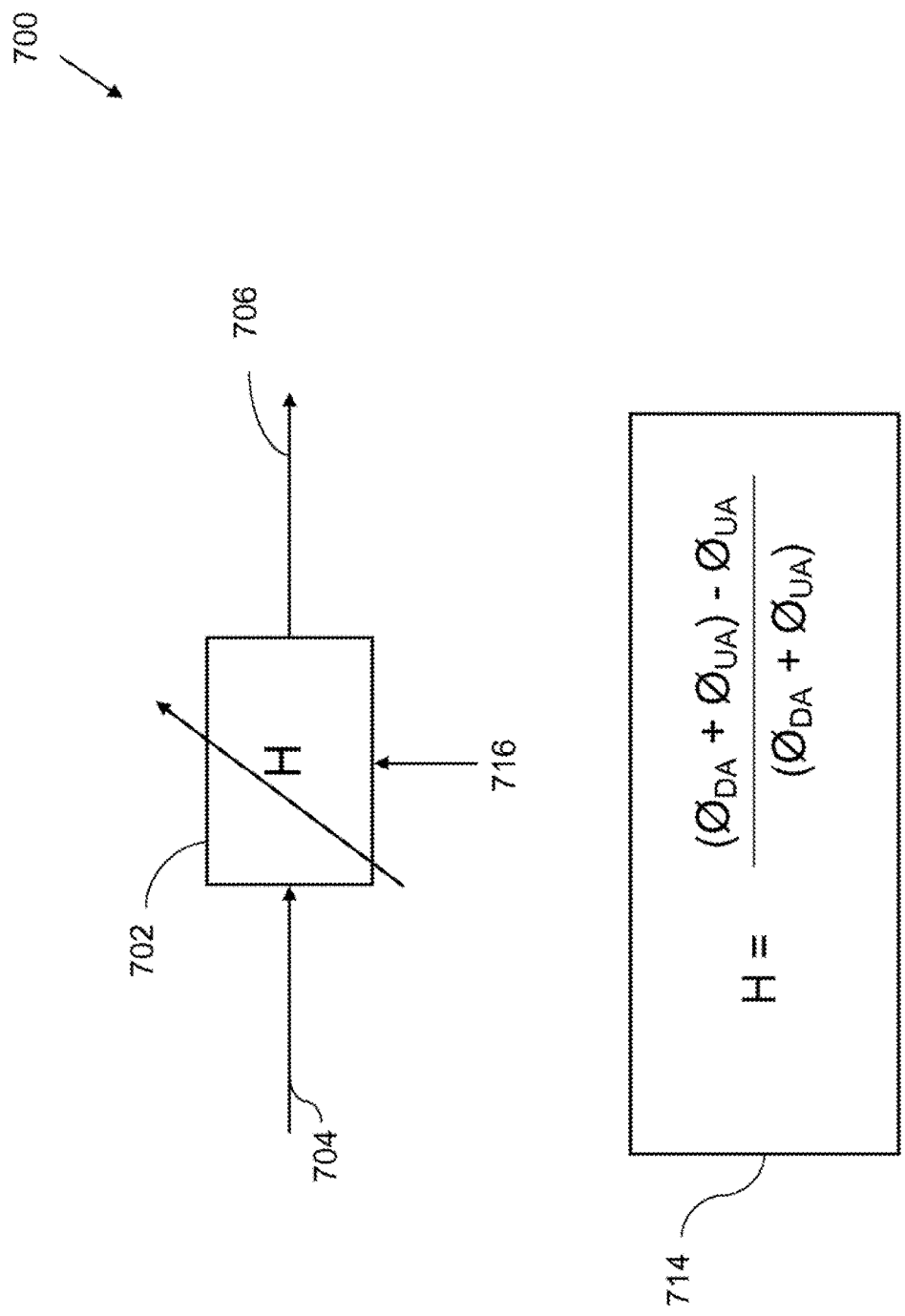
FIG. 7 illustrates single channel filtering according to embodiments of the invention.

FIG. 7 illustrates, generally at 700, single channel filtering according to embodiments of the invention. With reference to FIG. 7, a single channel noise reduction unit utilizes a linear filter having a single channel input. Examples of filters suitable for use therein are a Werner filter, a filter employing Minimum Mean Square Error (MMSE), etc. An output from an adaptive noise cancellation unit (such as one described above in the preceding figures) is input at 704 into a filter 702. The input signal 704 contains desired audio and a noise component, i.e., undesired audio, represented in equation 714 as the total, power $(\emptyset_{DA}+\emptyset_{UA})$. The filter 702 applies the equation shown at 714 to the input signal 704. An estimate for the total power $(\emptyset_{DA}+\emptyset_{UA})$ is one term in the numerator of equation 714 and is obtained from the input to the filter 704. An estimate for the noise $\emptyset_{UA}$, i.e., undesired audio is obtained when desired audio is absent from signal 704. The noise estimate $\emptyset_{UA}$ is the other term in the numerator, which is subtracted from the total power $(\emptyset_{DA}+\emptyset_{UA})$. The total power is the term in the denominator of equation 714. The estimate of the noise $\emptyset_{UA}$ (obtained when desired audio is absent) is obtained from the input signal 704 as informed by signal 716 received from inhibit logic, such, as inhibit logic 214 (FIG. 2) which indicates when desired audio is present as well as when desired audio is not present. The noise estimate is updated when desired audio is not present on signal 704. When desired audio is present, the noise estimate is frozen and the filtering proceeds with the noise estimate previously established during the last interval when desired audio was not present.

Figure 8A:
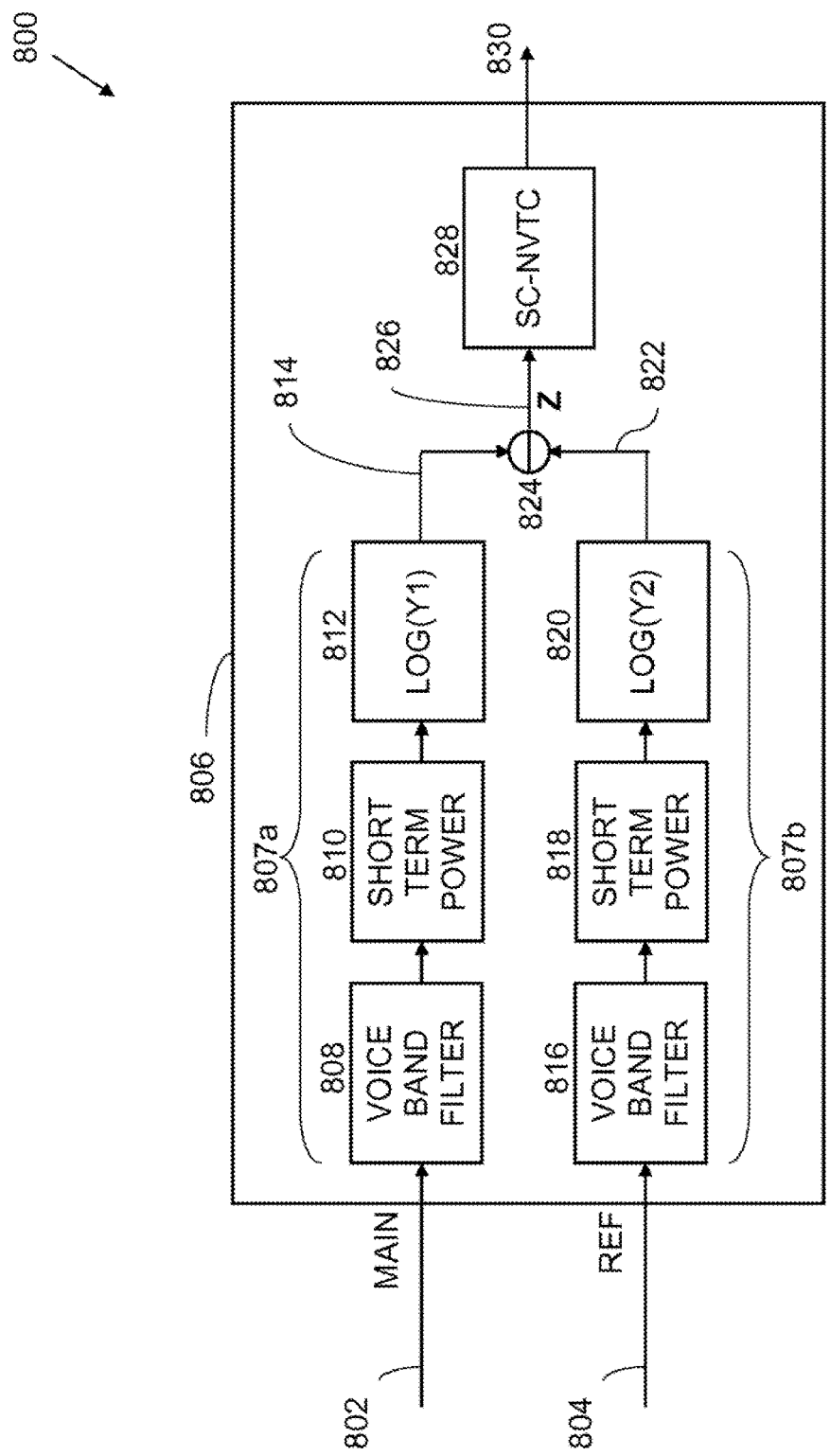
FIG. 8A illustrates desired voice activity detection according to embodiments of the invention.
Figure 8B:
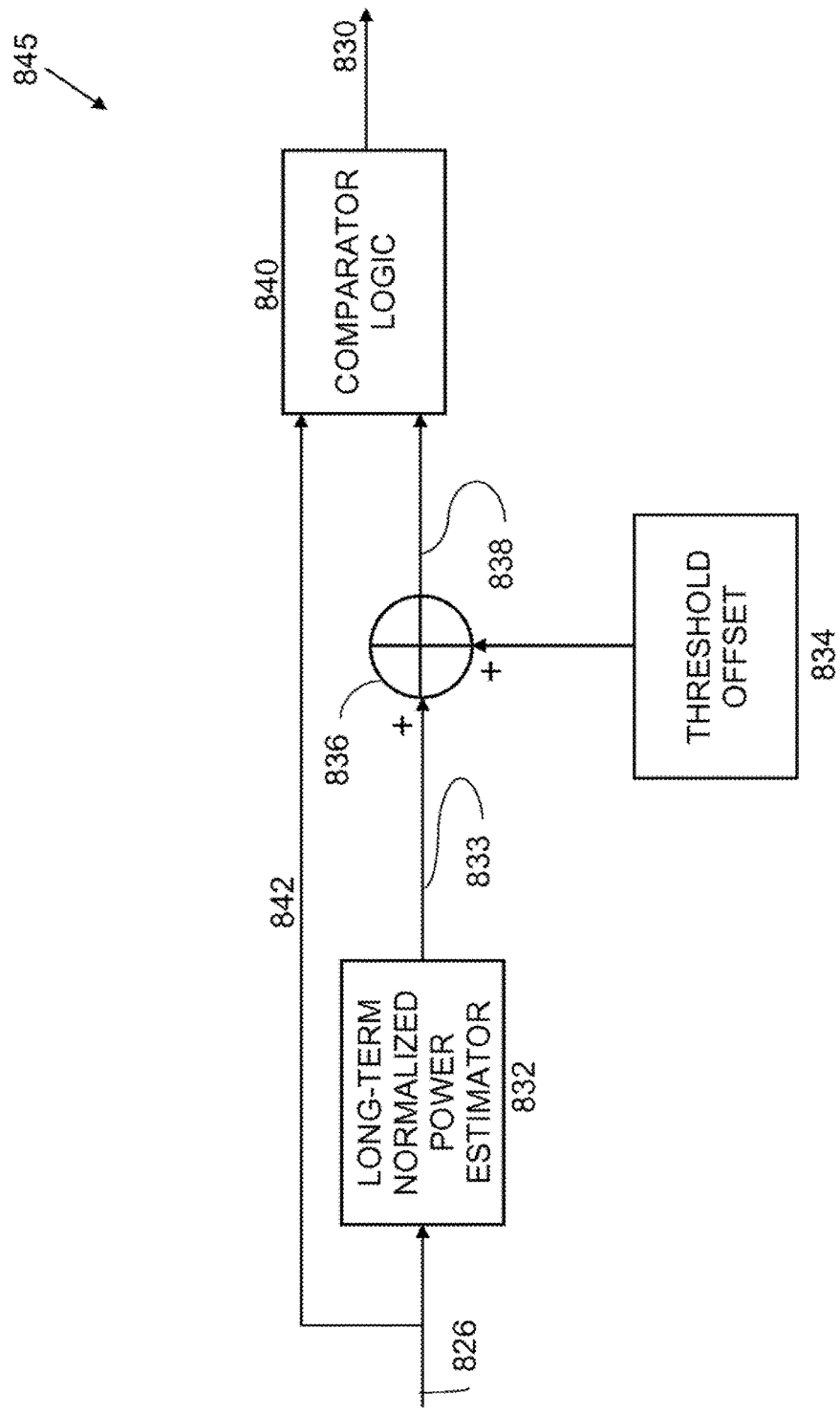
FIG. 8B illustrates a normalized voice threshold comparator according to embodiments of the invention.

FIG. 8A illustrates, generally at 800, desired voice activity detection according to embodiments of the invention. With reference to FIG. 8A, a dual input desired voice detector is shown at 806. Acoustic signals front a main channel are input at 802, from for example, a beamformer or from a main acoustic channel as described above in conjunction with the previous figures, to a first signal path 807*a* of the dual input desired voice detector 806. The first signal path 807*a* includes a voice band filter 808. The voice band filter 808 captures the majority of the desired voice energy in the main acoustic channel 802. In various embodiments, the voice band filter 808 is a band-pass filter characterized by a lower corner frequency an upper corner frequency and a roll-off from the upper corner frequency. In various embodiments, the lower corner frequency can range from 50 to 300 Hz depending on the application. For example, in wide band telephony, a lower corner frequency is approximately 50 Hz. In standard telephony the lower corner frequency is approximately 300 Hz. The upper corner frequency is chosen to allow the filter to pass a majority of the speech energy picked up by a relatively flat portion of the microphone's frequently response. Thus, the upper corner frequency can be placed in a variety of locations depending on the application. A non-limiting example of one location is 2,500 Hz. Another non-limiting location for the upper corner frequency is 4,000 Hz.

The first signal path 807a Includes a short-term power calculator 810. Short-term power calculator 810 is implemented in various embodiments as a root mean square (RMS) measurement, a power detector, an energy defector, etc. Short-term power calculator 810 can be referred to synonymously as a short-time power calculator 810. The short-term power detector 810 calculates approximately the instantaneous power in the filtered signal. The output of the short-term power detector 810 (Y1) is input into a signal compressor 812. In various embodiments compressor 812 converts the signal to the $Log_2$ domain. $Log_{10}$ domain, etc. In other embodiments, the compressor 812 performs a user defined compression algorithm on the signal Y1.

Similar to the first signal path described above, acoustic signals from a reference acoustic channel are input at 804, from for example, a beamformer or from a reference acoustic channel as described above in conjunction with the previous figures, to a second signal path 807b of the dual input desired voice detector 806. The second signal path 807b includes a voice band filter 816. The voice band filter 816 captures the majority of the desired voice energy in the reference acoustic channel 804. In various embodiments, the voice band filter 816 is a band-pass filter characterized by a tower corner frequency an upper corner frequency and a roll-off from the upper corner frequency as described above for the first signal path and the voice-band filter 808.

The second signal path 807b includes a short-term power calculator 818. Short-term power calculator 818 is implemented in various embodiments as a root mean square (RMS) measurement, a power detector, an energy detector, etc. Short-term power calculator 818 can be referred to synonymously as a short-time power calculator 818. The short-term power detector 818 calculates approximately the instantaneous power in the filtered signal. The output of the short-term power detector 818 (Y2) is input into a signal compressor 820. In various embodiments compressor 820 converts the signal to the $Log_2$ domain, $Log_{10}$ domain, etc. In other embodiments, the compressor 820 performs a user defined compression algorithm, on the signal Y2.

The compressed signal from the second signal path 822 is subtracted from the compressed signal from the first signal path 814 at a subtracter 824, which results in a normalized main signal at 826 (Z). In other embodiments, different compression functions are applied at 812 and 820 which result in different normalizations of the signal at 826, in other embodiments, a division operation can be applied at 824 to accomplish normalization when logarithmic compression is not implemented. Such as for example when compression based on the square root function is implemented.

The normalized main signal 826 is input to a single channel normalized voice threshold comparator (SC-NVTC) 828, which results, in a normalized desired voice activity detection signal 830. Note that the architecture of the dual channel voice activity detector provides a detection of desired voice using the normalized desired voice activity detection signal 830 that is based on an overall difference in signal-to-noise ratios for the two input channels. Thus, the normalized desired voice activity detection signal 830 is based on the integral of the energy in the voice band and not on the energy in particular frequency bins, thereby maintaining linearity within the noise cancellation units described above. The compressed signals 814 and 822, utilizing logarithmic compression, provide an input at 826 (Z) which has a noise floor that can take on values that vary from below zero to above zero (see column 895c, column 895d, or column 895e FIG. 8E below), unlike an uncompressed single channel input which has a noise floor which is always above zero (see column 805b FIG. 8E below).

FIG. 8B illustrates, generally at 845, a single channel normalized voice threshold comparator (SC-NVTC) according to embodiments of the invention. With reference to FIG. 8B, a normalized main signal 826 is input into a long-term normalized power estimator 832. The long-term normalized power estimator 832 provides a running estimate of the normalized main signal 826. The running estimate provides a floor for desired audio. An offset value 834 is added in an adder 836 to a running estimate of the output of the long-term normalized power estimator 832. The output of the adder 838 is input to comparator 840. An instantaneous estimate 842 of the normalized main signal 826 is input to the comparator 840. The comparator 840 contains logic that compares the instantaneous value at 842 to the running ratio plus offset at 838. If the value at 842 is greater than the value at 838, desired audio is detected and a flag is set accordingly and transmitted as part of the normalized desired voice activity detection signal 830. If the value at 842 is less than the value at 838 desired audio is not detected and a flag is set accordingly and transmitted as part of the normalized desired voice activity detection signal 830. The long-term normalized power estimator 832 averages the normalized, main signal 826 for a length of time sufficiently long in order to slow down the change in amplitude fluctuations. Thus, amplitude fluctuations are slowly changing at 833. The averaging time can vary from a fraction of a second to minutes, by way of non-limiting examples. In various embodiments, an averaging time is selected to provide slowly changing amplitude fluctuations at the output of 832.

Figure 8C:
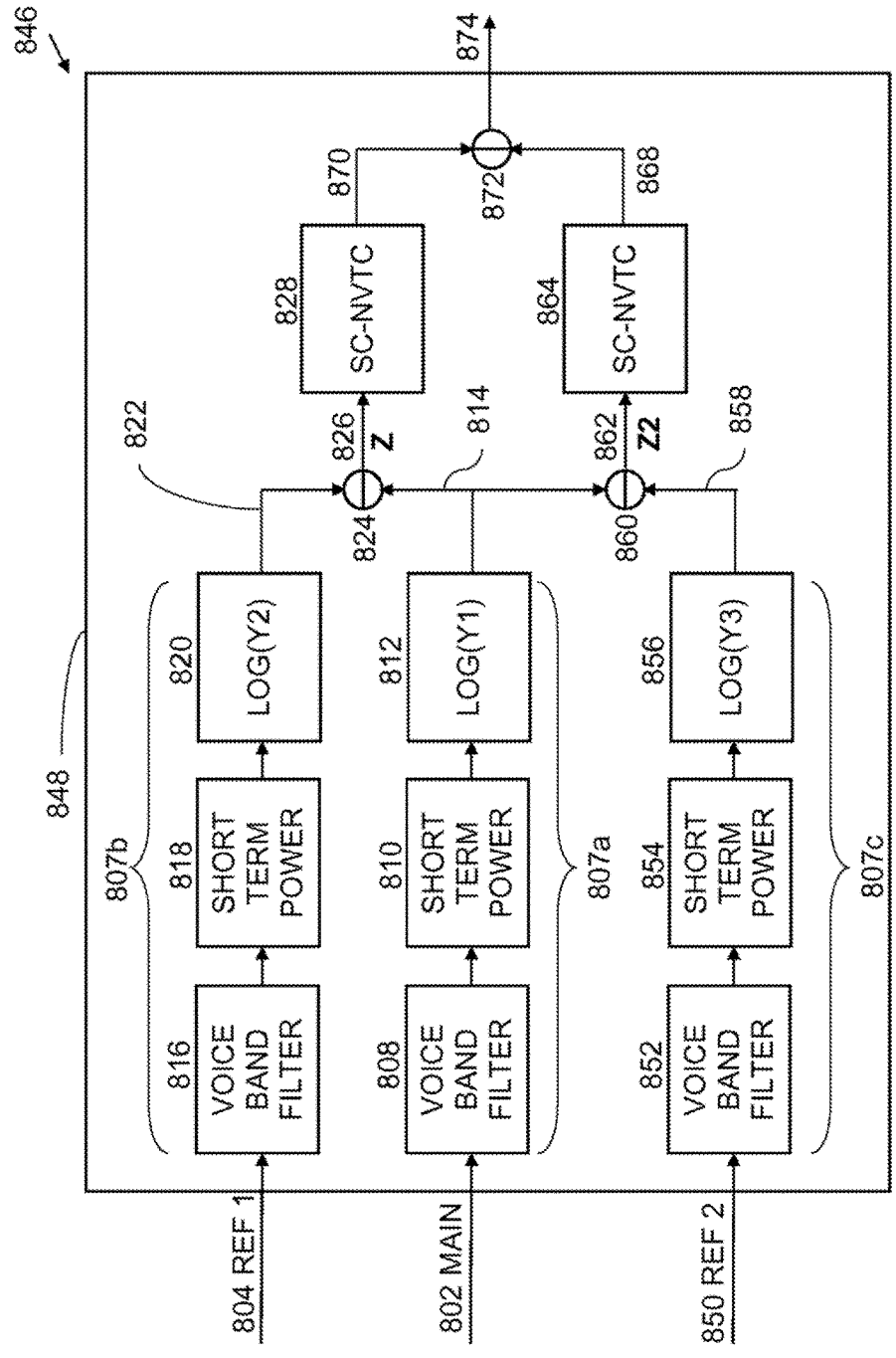
FIG. 8C illustrates desired voice activity detection utilizing multiple reference channels, according to embodiments of the invention.

FIG. 8C illustrates, generally at 846, desired voice activity detection utilizing multiple reference channels, according to embodiments of the invention. With reference to FIG. 8C, a desired voice detector is shown at 848. The desired voice detector 848 includes as an input the main channel 802 and the first signal path 807a (described above in conjunction with FIG. 8A), together with the reference channel 804 and the second signal path 807b (also described above in conjunction with FIG. 8A). In addition thereto, is a second reference acoustic-channel 850 which is input into the desired voice detector 848 and is part of a third signal, path 807c. Similar to the second signal path 807b (described above), acoustic signals from the second reference acoustic channel are input at 850, from for example, a beamformer or from a second reference acoustic channel as described above in conjunction with the previous figures, to a third signal path 807c of the multi-input desired voice detector 848. The third signal path 807c includes a voice band filter 852. The voice band filter 852 captures the majority of the desired voice energy in the second reference acoustic channel 850. In various embodiments, the voice band filter 852 is a band-pass filter characterized by a lower corner frequency an upper corner frequency and a roll-off from the upper corner frequency as described above for the second signal path and the voice-band filter 808.

The third signal path 807c includes a short-term power calculator 854. Short-term power calculator 854 is implemented in various embodiments as a root mean square (RMS) measurement, a power detector, an energy detector, etc. Short-term power calculator 854 can be referred to synonymously as a short-time power calculator 854. The short-term power detector 854 calculates approximately the instantaneous power in the filtered signal. The output of the short-term power detector 854 is input into a signal compressor 856. In various embodiments compressor 856 converts the signal, to the $Log_2$ domain, $Log_{10}$ domain, etc. In other embodiments, the compressor 854 performs a user defined compression algorithm on the signal Y3.

The compressed signal from the third signal path 858 is subtracted from the compressed signal from the first signal path 814 at a subtractor 860, which results in a normalized main signal at 862 (Z2). In other embodiments, different compression functions are applied at 856 and 812 which result in different normalizations of the signal at 862. In other embodiments, a division operation can be applied at 860 when logarithmic compression is not implemented. Such as for example when compression based on the square root function is implemented.

The normalized main signal 862 is input to a single channel normalized voice threshold comparator (SC-NVTC) 864, which results in a normalized desired voice activity detection signal 868. Note that the architecture of the multi-channel voice activity detector provides a detection of desired voice using the normalized desired voice activity detection signal 868 that is based on an overall difference in signal-to-noise ratios for the two input channels. Thus, the normalized desired voice activity detection signal 868 is based on the integral of the energy in the voice band and not on the energy in particular frequently bins, thereby maintaining linearity within the noise cancellation units described above. The compressed signals 814 and 858 utilizing logarithmic compression, provide an input at 862 (Z2) winch has a noise floor that can take on values that vary from below zero to above zero (see column 895c, column 895d, or column 895e FIG. 8E below), unlike an uncompressed single channel input which has a noise floor which is always above zero (see column 895b FIG. 8E below).

The desired voice detector 848, having a multi-channel input with at least two reference channel inputs, provides two normalized desired voice activity detection signals 868 and 870 which are used to output a desired voice activity signal 874. In one embodiment, normalized desired voice activity detection signals 868 and 870 are input into a logical OR-gate 872. The logical OR-gate outputs the desired voice activity signal 874 based on its inputs 868 and 870. In yet other embodiments, additional reference channels can be added to the desired voice detector 848. Each additional reference channel is used to create another normalized main channel which is input into another single channel normalized voice threshold comparator (SC-NVTC) (not shown). An output from the additional single channel normalized voice threshold comparator (SC-NVTC) (not shown) is combined with 874 via an additional exclusive OR-gate (also not shown) (in one embodiment) to provide the desired voice activity signal which is output as described above in conjunction with the preceding figures. Utilizing additional reference channels in a multi-channel desired voice detector, as described above, results in a more robust detection of desired audio because more in formulation is obtained on the noise field via the plurality of reference channels.

Figure 8D:
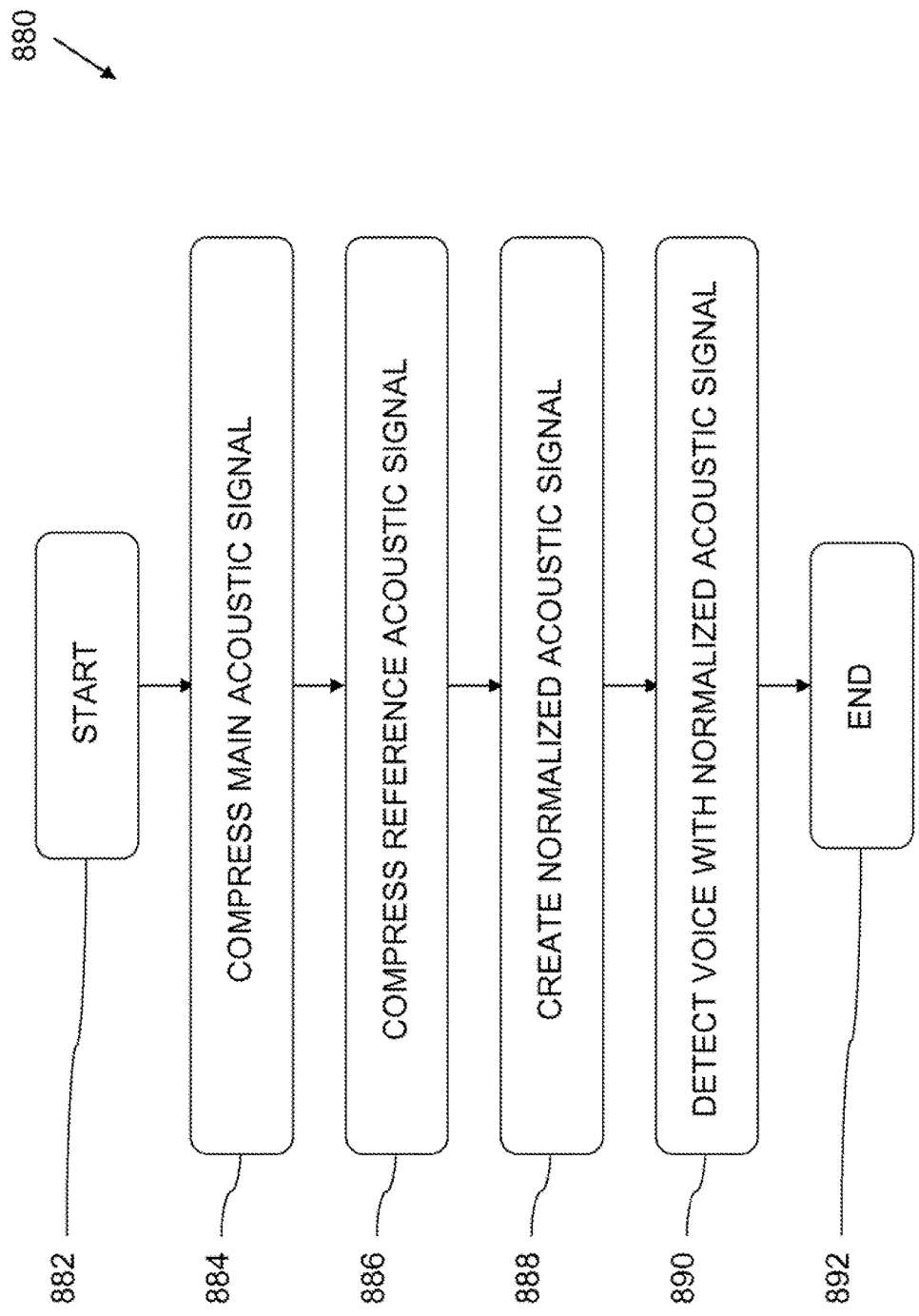
FIG. 8D illustrates a process utilizing compression according to embodiments of the invention.

FIG. 8D illustrates, generally at 880, a process utilizing compression according to embodiments of the invention. With reference to FIG. 8D, a process starts at a block 882. At a block 884 a main acoustic channel is compressed, utilizing for example $Log_{10}$ compression or user defined compression as described in conjunction with FIG. 8A or FIG. 8C. At a block 886 a reference acoustic signal is compressed, utilizing for example $Log_{10}$ compression or user defined compression as described in conjunction with FIG. 8A or FIG. 8C. At a block 888 a normalized main acoustic signal is created. At a block 890 desired voice is detected with the normalized acoustic signal. The process slops at a block 892.

FIG. 8E illustrates, generally at 893, different functions to provide compression according to embodiments of the invention. With reference to FIG. SE, a table 894 presents several compression functions for the purpose of illustration, no limitation is implied thereby. Column 895a contains six sample values for a variable X. In this example, variable X takes on values as shown at 896 ranging from 0.03 to 1000.0. Column 895b illustrates no compression where Y=X. Column 895c illustrates Log base 10 compression where the compressed value $Y=Log_{10}(X)$. Column 895d illustrates $ln(X)$ compression where the compressed alone $Y=ln(X)$. Column 805c illustrates log base 2 compression where $Y=Log_2(X)$. A user defined compression (not shown) can also be implemented as desired to provide more or less compression than 895c, 895d, or 895e. Utilizing a compression function at 812 and 820 (FIG. 8A) to compress the result of the short-term power detectors 810 and 818 reduces the dynamic range of the normalized main signal at 826 (Z) which is input into the single channel normalized voice threshold comparator (SC-NVTC) 828. Similarly utilizing a compression function at 812, 820 and 856 (FIG. 8C) to compress the results of the short-term power detectors 810, 818, and 854 reduces the dynamic range of the normalized main signals at 826 (Z) and 862 (Z2) which are input into the SC-NVTC 828 and SC-NVTC 864 respectively. Reduced dynamic range achieved via compression can result in more accurately defecting the presence of desired audio and therefore a greater degree of noise reduction can be achieved by the embodiments of the invention presented herein.

In various embodiments, the components of the multi-input desired voice detector, such as shown in FIG. 8A, FIG. 8B, FIG. 8C, FIG. 8D, and FIG. 8E are implemented in an integrated circuit device, which may include an integrated circuit package containing the integrated circuit. In some embodiments, the multi-input desired voice detector is implemented in a single integrated circuit die. In other embodiments, the multi-input desired voice detector is implemented in more than one integrated circuit the of an integrated circuit de vice which may include a multi-chip package containing the integrated circuit.

Figure 9A:
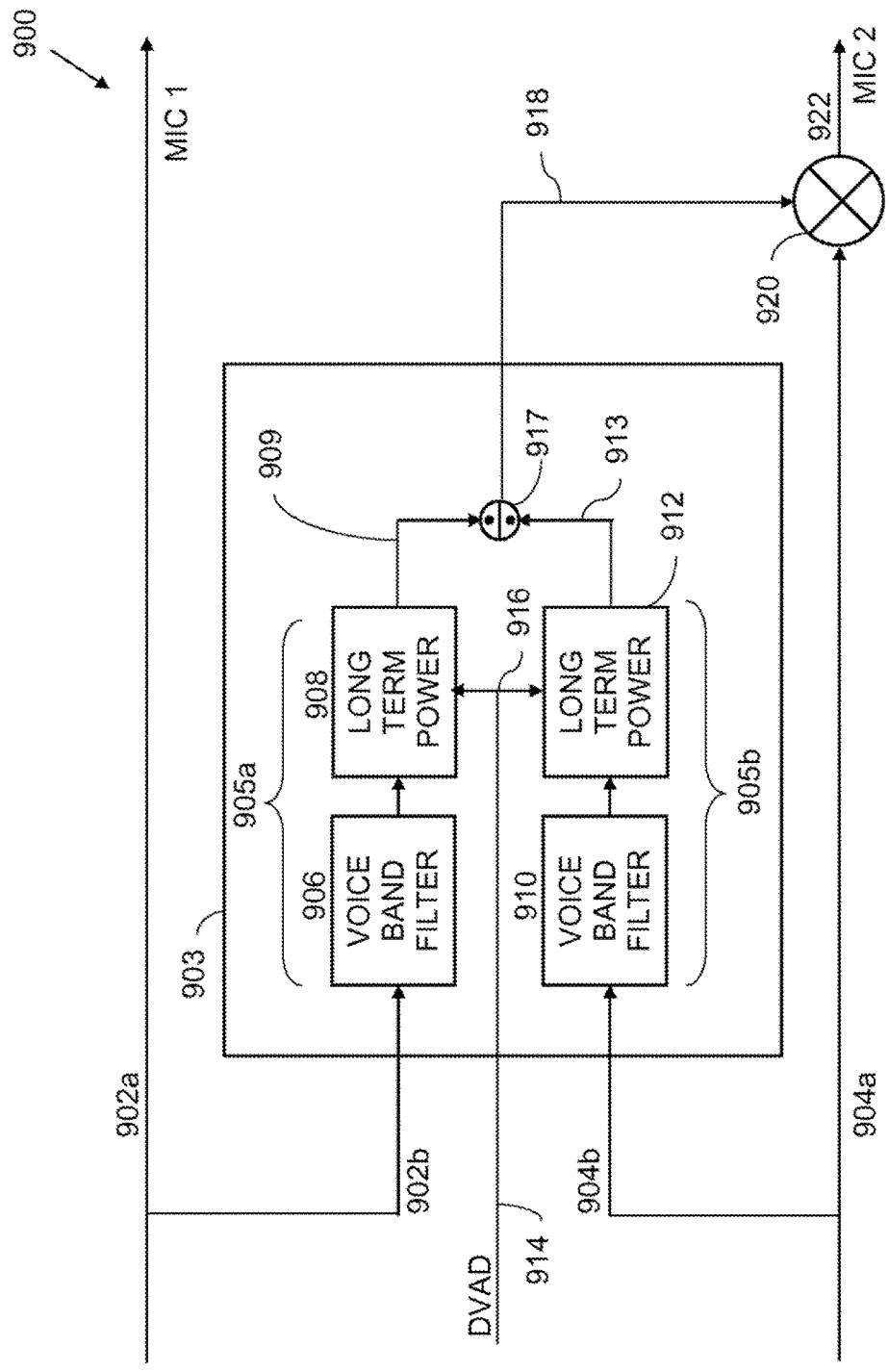
FIG. 9A illustrates an auto-balancing architecture according to embodiments of the invention.

FIG. 9A illustrates, generally at 900, an auto-balancing architecture according to embodiments of the invention. With reference to FIG. 9A, an auto-balancing component 903 has a first signal path 905a and a second signal path 905b. A first acoustic channel 902a (MIC 1) is coupled to the first signal path 905a at 902b. A second acoustic channel 904a is coupled to the second signal path 905b at 904b. Acoustic signals are input at 902b into a voice-band filter 906. The voice band filter 906 captures the majority of the desired voice energy in the first acoustic channel 902a. In various embodiments, the voice band filter 906 is a bandpass filter characterized by a lower corner frequency an upper corner frequency and a roll-off from the upper corner frequency. In various embodiments, the lower corner frequency can range from 50 to 300 Hz depending on the application, for example, in wide band telephony, a lower corner frequency is approximately 50 Hz. In standard telephony the lower corner frequency is approximately 300 Hz. The upper corner frequency is chosen to allow the filter to pass a majority of the speech energy picked up by a relatively flat portion of the microphone's frequency response. Thus, the upper corner frequency can be placed in a variety of locations depending on the application. A non-limiting example of one location is 2,500 Hz. Another non-limiting location for the upper corner frequency is 4,000 Hz.

The first signal path 905a includes a long-term power calculator 908. Long-term power calculator 908 is implemented in various embodiments as a root mean square (RMS) measurement, a power detector, an energy detector, etc. Long-term power calculator 908 can be referred to synonymously as a long-time power calculator 908. The long-term power calculator 908 calculates approximately the running average long-term power in the filtered signal. The output 909 of the long-term power calculator 908 is input into a divider 917. A control signal 914 is input at 916 to the long-term power calculator 908. The control signal 914 provides signals as described above m conjunction with the desired audio detector, e.g., FIG. 8A, FIG. 8B, FIG. 8C which indicate when desired audio is present and when desired audio is not present. Segments of the acoustic signals on the first channel 902b which have desired audio present are excluded from the long-term power average produced at 908.

Acoustic signals are input at 904b into a voice-band filter 910 of the second signal path 905b. The voice band filter 910 captures the majority of the desired, voice energy in the second acoustic channel 904a. In various embodiments, the voice band filter 910 is a band-pass filter characterized by a lower corner frequency an upper corner frequency and a roll-off from the upper corner frequently. In various embodiments, the lower corner frequency can range from 50 to 300 Hz depending on the application. For example, in wide band telephony, a lower corner frequency is approximately 50 Hz. In standard telephony the lower corner frequency is approximately 300 Hz. The upper corner frequency is chosen to allow the filter to pass a majority of the speech energy picked up by a relatively flat portion of the microphone's frequency response. Thus, the upper corner frequency can be placed in a variety of locations depending on the application. A non-limiting example of one location is 2,500 Hz. Another non-limiting location for the upper corner frequency is 4,000 Hz.

The second signal path 905b includes a long-term power calculator 912. Long-term power calculator 912 is implemented in various embodiments as a root mean square (RMS) measurement, a power detector, an energy detector, etc. Long-terra power calculator 912 can be referred to synonymously as a long-time power calculator 912. The long-term power calculator 912 calculates approximately the running average long-term power in the filtered signal. The output 913 of the long-term power calculator 912 is input into a divider 917. A control signal 914 is input at 916 to the long-terra power calculator 912. The control signal 916 provides signals as described above in conjunction with the desired audio detector, e.g., FIG. 8A, FIG. 8B, FIG. 8C which indicate when desired audio is present and when desired audio is not present. Segments of the acoustic signals on the second channel 904b which have desired audio present are excluded from the long-term power average produced at 912.

In one embodiment, the output 909 is normalized at 917 by the output 913 to produce an amplitude correction signal 918. In one embodiment, a divider is used at 917. The amplitude correction signal 918 is multiplied at multiplier 920 times an instantaneous value of the second microphone signal on 904a to produce a corrected second microphone signal at 922.

In another embodiment, alternatively the output 913 is normalized at 917 by the output 909 to produce an amplitude correction signal 918. In one embodiment, a divider is used at 917. The amplitude correction signal 918 is multiplied by an instantaneous value of the first microphone signal on 902a using a multiplier coupled to 902a (not shown) to produce a corrected first, microphone signal for the first microphone channel 902a. Thus, in various embodiments, either the second microphone signal is automatically balanced relative to the first microphone signal or in the alternative the first microphone signal is automatically balanced relative to the second microphone signal.

It should be noted that the long-term averaged power calculated at 908 and 912 is performed when desired audio is absent. Therefore, the averaged power represents an average of the undesired audio which typically originates in the far field. In various embodiments, by way of non-limiting example, the duration of the long-term power calculator ranges from approximately a fraction of a second such as, for example, one-half second to five seconds to minutes in some embodiments and is application dependent.

Figure 9B:
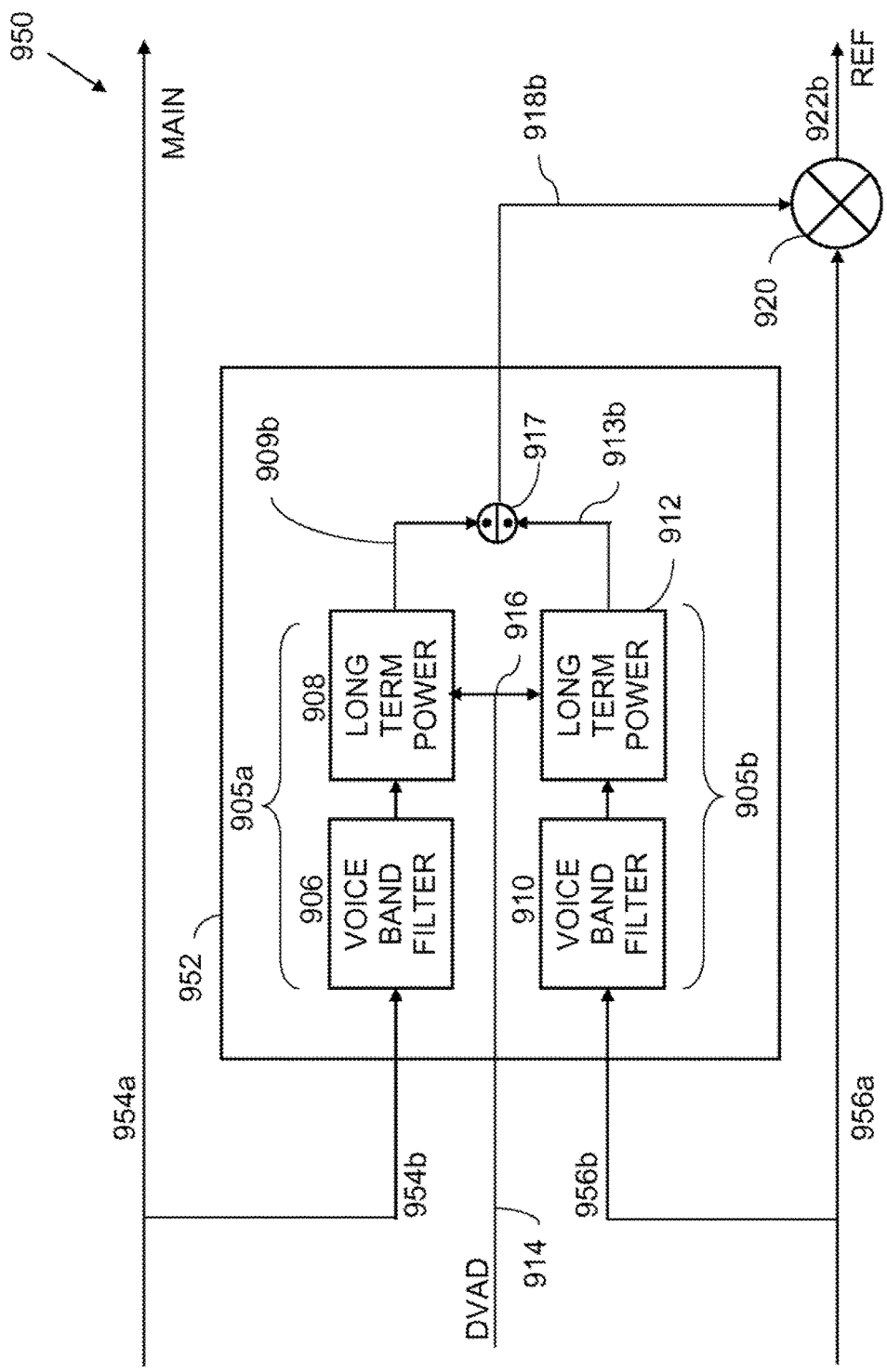
FIG. 9B illustrates auto-balancing according to embodiments of the invention.

FIG. 9B illustrates, generally at 950, auto-balancing according to embodiments of the invention. With, reference to FIG. 9B, an auto-balancing component 952 is configured to receive as inputs a main acoustic channel 954a and a reference acoustic channel 956a. The balancing function proceeds similarly to the description provided above in conjunction with FIG. 9A using the first acoustic channel 902a (MIC 1) and the second acoustic channel 904a (MIC 2).

With reference to FIG. 9B, an auto-balancing component 952 has a first signal path 905a and a second signal path 905b. A first acoustic channel 954a (MAIN) is coupled to the first signal path 905a at 954b. A second acoustic channel 956a, is coupled to the second signal path 905b at 956b. Acoustic signals are input at 954b into a voice-band filter 906. The voice band filter 906 captures the majority of the desired voice energy in the first acoustic channel 954a. In various embodiments, the voice band filter 906 is a bandpass filter characterized by a lower corner frequency an upper corner frequency and a roll-off from the upper corner frequency. In various embodiments, the lower corner frequency can range from 30 to 300 Hz, depending on the application. For example, in wide band telephony, a lower corner frequency is approximately 50 Hz. In standard telephony the lower corner frequency is approximately 300 Hz. The upper corner frequency is chosen to allow the filter to pass a majority of the speech energy picked up by a relatively flat portion of the microphone's frequency response. Thus, the upper corner frequency can be placed in a variety of locations depending on the application. A non-limiting example of one location is 2,500 Hz. Another non-limiting location for the upper corner frequency is 4,000 Hz.

The first signal path 905a includes a long-term power calculator 908. Long-term power calculator 908 is implemented in various embodiments as a root mean square (RMS) measurement, a power detector, an energy detector, etc. Long-term power calculator 908 can be referred to synonymously as a long-time power calculator 908. The long-term power calculator 908 calculates approximately the running average long-term power in the filtered signal. The output 909b of the long-term power calculator 908 is input into a divider 917. A control signal 914 is input at 916 to tire long-term power calculator 908. The control signal 914 provides signals as described above in conjunction with the desired audio detector, e.g., FIG. 8A, FIG. 8B, FIG. 8C which indicate when desired audio is present and when desired audio is not present. Segments of the acoustic signals on the first channel 954b which have desired audio present are excluded from the long-term power average produced at 908.

Acoustic signals are input at 956b into a voice-baud filter 910 of the second signal path 905b. The voice band filter 910 captures the majority of the desired voice energy in the second acoustic channel 956a. In various embodiments, the voice band filter 910 is a band-pass filter characterized by a lower corner frequency an upper corner frequency and a roll-off from the upper corner frequency. In various embodiments, the lower corner frequency can range from 50 to 300 Hz depending on the application. For example, in wide band telephony, a lower corner frequency is approximately 50 Hz. In standard telephony the lower corner frequency is approximately 300 Hz. The upper corner frequency is chosen to allow the filter to pass a majority of the speech energy picked up by a relatively flat portion of the microphone's frequency response. Thus, the upper corner frequency can be placed in a variety of locations depending on the application. A non-limiting example of one location is 2,500 Hz. Another non-limiting location for the upper corner frequency is 4,000 Hz.

The second signal path 905b includes a long-term power calculator 912. Long-term power calculator 912 is implemented in various embodiments as a root mean square (RMS) measurement, a power detector, an energy detector, etc. Long-term power calculator 912 can be referred to synonymously as a long-time power calculator 912. The long-term power calculator 912 calculates approximately the running average long-term power in the filtered signal. The output 913b of the long-term power calculator 912 is input into the divider 917. A control signal 914 is input, at 916 to the long-term power calculator 912. The control signal 916 provides signals as described above in conjunction with the desired audio detector, e.g., FIG. 8A, FIG. 8B, FIG. 8C which indicate when desired audio is present and when desired audio is not present. Segments of the acoustic signals on the second channel 956b which have desired audio present are excluded from the long-term power average produced at 912.

In one embodiment, the output 909b is normalized at 917 by the output 913b to produce an amplitude correction signal 918b. In one embodiment, a divider is used at 917. The amplitude correction signal 918b is multiplied at multiplier 920 times an instantaneous value of the second microphone signal on 956a to produce a corrected second microphone signal at 922b.

In another embodiment, alternatively the output 915b is normalized at 917 by the output 909b to produce an amplitude correction signal 918b. In one embodiment, a divider is used at 917. The amplitude correction signal 918b is multiplied by an instantaneous value of the first microphone signal on 954a using a multiplier coupled to 954a (not shown) to produce a corrected first microphone signal for the first microphone channel 954a. Thus, in various embodiments, either the second microphone signal is automatically balanced relative to the first microphone signal or in the alternative the first microphone signal is automatically balanced relative to the second microphone signal.

It should be noted that the long-term averaged power calculated at 908 and 912 is performed when desired audio is absent. Therefore, the averaged, power represents an average of the undesired audio which typically originates in the far field. In various embodiments, by way of non-limiting example, the duration of the long-term power calculator ranges from approximately a fraction of a second such as, for example, one-half second to five seconds to minutes in some embodiments and is application dependent.

Embodiments of the auto-balancing component 902 or 952 are configured for auto-balancing a plurality of microphone channels such, as is indicated in FIG. 4A. In such configurations, a plurality of channels (such as a plurality of reference channels) is balanced with respect to a main channel. Or a plurality of reference channels and a main channel are balanced with respect to a particular reference channel as described above in conjunction with FIG. 9A or FIG. 9B.

Figure 9C:
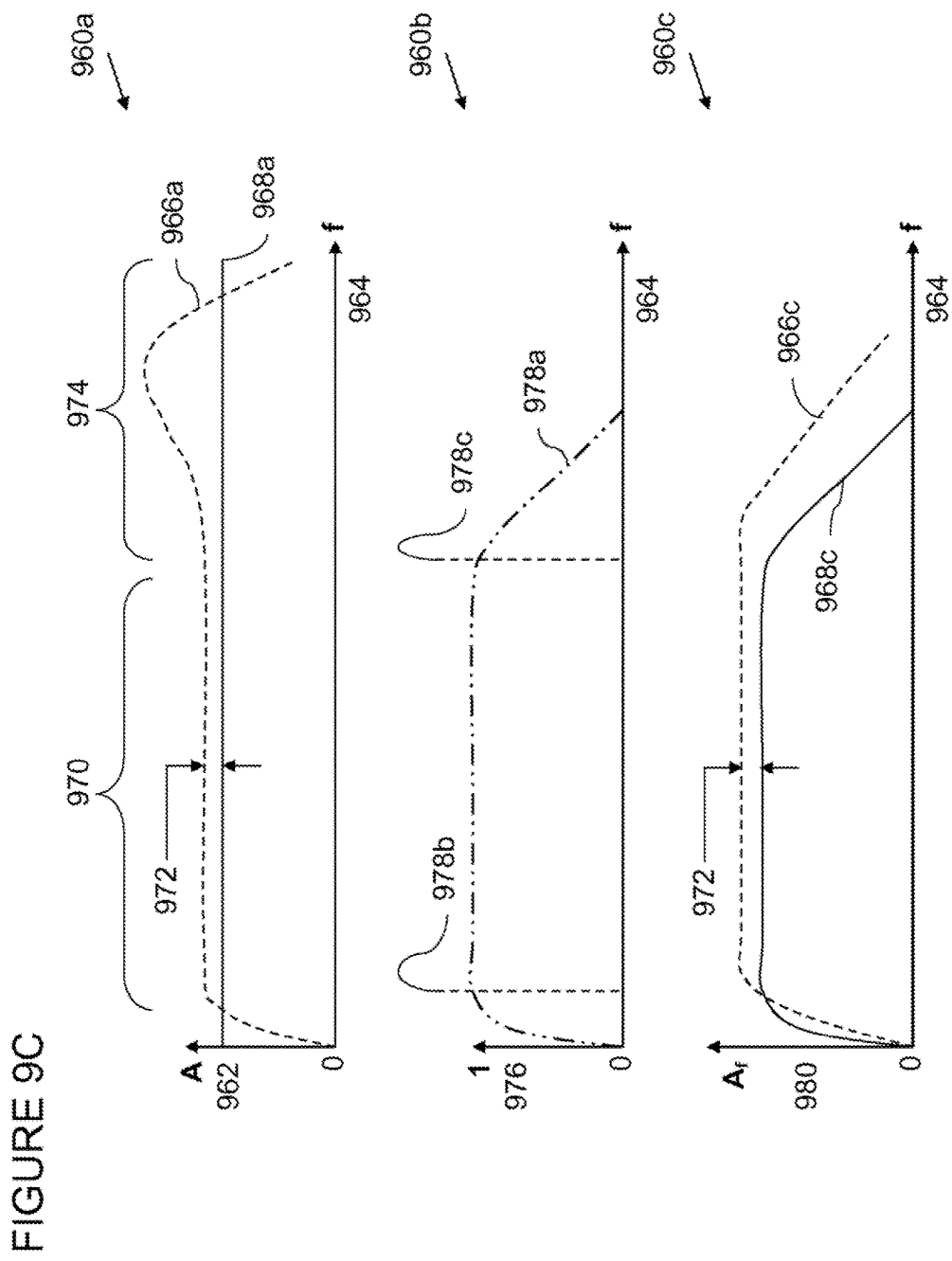
FIG. 9C illustrates filtering according to embodiments of the invention.

FIG. 9C illustrates filtering according to embodiments of the invention. With reference to FIG. 9C, 960a shows two microphone signals 966a and 968a having amplitude 962 plotted as a function of frequency 964. In some embodiments, a microphone does not have a constant sensitivity as a function of frequency. For example, microphone response 966a can illustrate a microphone output (response) with a non-flat frequency response excited by a broadband excitation which is flat in frequency. The microphone response 966a includes a non-flat region 974 and a flat region 970. For this example, a microphone which produced the response 968a has a uniform sensitivity with, respect to frequency; therefore 968a is substantially flat in response to the broadband excitation which is flat with frequency. In some embodiments, it is of interest to balance the flat region 970 of the microphones' responses. In such a case, the non-flat region 974 is filtered out so that the energy in the non-flat region 974 does not influence the microphone auto-balancing procedure. What is of interest is a difference 972 between the flat regions of the two microphones' responses.

In 960b a filter function 978a is shown plotted with an amplitude 976 plotted as a function of frequency 964. In various embodiments, the filter function is chosen to eliminate the non-flat portion 974 of a microphone's response. Filter function 978a is characterized by a lower corner frequency 978b and an upper corner frequency 978c. The filter function of 960b is applied to the two microphone signals 966a and 968a and the result is shown in 960c.

In 960c filtered representations 966c and 968c of microphone signals 966a and 968a are plotted as a function of amplitude 980 and frequency 966. A difference 972 characterizes the difference in sensitivity between the two filtered microphone signals 966c and 968c, it is this difference between the two microphone responses that is balanced by the systems described above in conjunction with FIG. 9A and FIG. 9B. Referring back to FIG. 9A and FIG. 9B, in various embodiments, voice band filters 906 and 910 can apply, in one non-limiting example, the filter function shown in 960b to either microphone channels 902b and 904b (FIG. 9A) or to main and reference channels 954b and 956b (FIG. 9B). The difference 972 between the two microphone channels is minimized or eliminated by the auto-balancing procedure described above in FIG. 9A or FIG. 9B.

Figure 10:
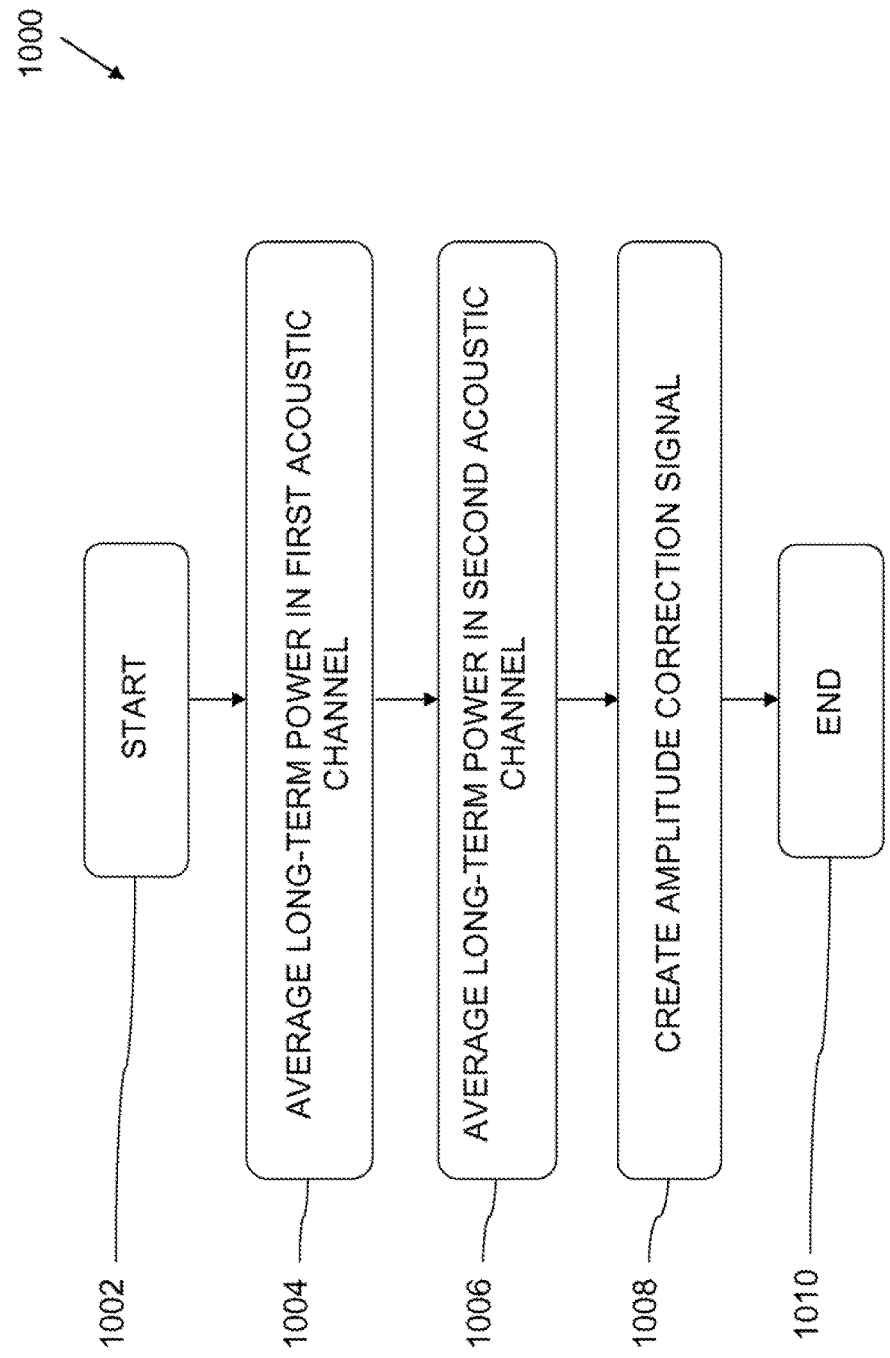
FIG. 10 illustrates a process for auto-balancing according to embodiments of the invention.

FIG. 10 illustrates, generally at 1000, a process for auto-balancing according to embodiments of the invention. With reference to FIG. 10, a process starts at a block 1002. At a block 1004 an average long-term power in a first microphone channel is calculated. The averaged long-term power calculated for the first microphone channel does not include segments of the microphone signal that occurred when desired audio was present. Input from a desired voice activity detector is used to exclude the relevant portions of desired audio. At a block 1006 an average power in a second microphone channel is calculated. The averaged long-term power calculated for the second microphone channel does not include segments of the microphone signal that occurred when desired audio was present. Input from a desired voice activity detector is used to exclude the relevant portions of desired audio. At a block 1008 an amplitude correction signal is computed using the averages computed in the block 1004 and the block 1006.

In various embodiments, the components of auto-balancing component 903 or 952 are implemented in an integrated circuit device, which may include an integrated circuit package containing the integrated circuit. In some embodiments, auto-balancing components 903 or 952 are implemented in a single integrated circuit die. In other embodiments, auto-balancing components 903 or 952 are implemented in more than one integrated circuit, the of an integrated circuit device which may include a multi-chip package containing the integrated circuit.

FIG. 11 illustrates, generally at 1100, an acoustic signal processing system in which embodiments of the invention may be used. The block diagram is a high-level conceptual representation and may be implemented in a variety of ways and by various architectures. With reference to FIG. 11, bus system 1102 interconnects a Central Processing Unit (CPU) 1104, Read Only Memory (ROM) 1106, Random Access Memory (RAM) 1108, storage 1110, display 1120, audio 1122, keyboard 1124, pointer 1126, data acquisition unit (DAU) 1128, and communications 1130. The bus system 1102 may be for example, one or more of such buses as a system bus. Peripheral Component Interconnect (PCI), Advanced Graphics Port (AGP). Small Computer System Interface (SCSI), Institute of Electrical and Electronics Engineers (IEEE) standard number 1394 (FireWire), Universal Serial Bus (USB), or a dedicated bus designed for a custom application, etc. The CPU 1104 may be a single, multiple, or even a distributed computing resource or a digital signal processing (DSP) chip. Storage 1110 may be Compact Disc (CD), Digital Versatile Disk (DVD), hard disks (HD), optical disks, tape, flash, memory sticks, video recorders, etc. The acoustic signal processing system 1100 can be used to receive acoustic signals that are input from a plurality of microphones (e.g., a first microphone, a second microphone, etc.) or from a main acoustic, channel and a plurality of reference acoustic channels as described above in conjunction with the preceding figures. Note that depending upon the actual implementation of the acoustic signal processing system, the acoustic signal processing system may include some, all, snore, or a rearrangement of components in the block diagram. In some embodiments, aspects of the system 1100 are performed in software. While in some embodiments, aspects of the system 1100 are performed in dedicated hardware such as a digital signal processing (DSP) chip, etc. as well as combinations of dedicated hardware and software as is known and appreciated by those of ordinary skill in the art.

Thus, in various embodiments, acoustic signal data is received at 1129 for processing by the acoustic signal processing system 1100. Such data can be transmitted at 1132 via communications interface 1130 for further processing in a remote location. Connection with a network, such as an intranet or the Internet is obtained via 1132, as is recognized by those of skill in the art, which enables the acoustic signal processing system 1100 to communicate with other data processing devices or systems in remote locations.

For example, embodiments of the invention can be implemented on a computer system 1100 configured as a desktop computer or work, station, on for example a WINDOWS® compatible computer running operating systems such as WINDOWS® XP Home or WINDOWS® XP Professional, Linux, Unix, etc. as well as computers from APPLE COMPUTER, Inc. running operating systems such as OS X, etc. Alternatively, or in conjunction with such an implementation, embodiments of the invention can be configured with devices such as speakers, earphones, video monitor, etc. configured for use with a Bluetooth communication channel. In yet other implementations, embodiments of the invention are configured to be implemented by mobile devices such as a smart phone, a tablet computer, a wearable device, such as eye glasses, a near-to-eye (NTE) headset, or the like.

For purposes of discussing and understanding the embodiments of the invention, it is to be understood, that, various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block, diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a sell-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, waveforms, data, time series or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes, of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk read-only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient, to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than, those described, including hand-held devices, multiprocessor systems, microprocessor-based or programmable consumer electronics, digital signal processing (DSP) devices, network PCs, minicomputers, mainframe computers, and tire like. The invention can also be practiced in distributed computing environments where tasks are performed, by remote processing devices that are linked through a communications network. In other examples, embodiments of the invention as described above in FIG. 1 through FIG. 11 can be implemented using a system on a chip (SOC), a Bluetooth chip, a digital signal processing (DSP) chip, a codec with integrated circuits (ICs) or in other implementations of hardware and software.

The methods of the invention may be implemented using computer software. If written in a programming language conforming to a recognized standard, sequences of instructions designed to implement the methods can be complied for execution on a variety of hardware platforms and for interface to a variety of opera ting systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, mathematical expression, flow diagram or flow chart. Thus, one of ordinary skill in the art would recognize a block denoting A+B=C as an additive function whose implementation m hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "One embodiment" imply that there is but a single embodiment of the invention. For example, a feature, structure, act, etc. described in "one embodiment" may also be included. In other embodiments. Thus, the invention may include a variety of combinations and/or integrations of the embodiments, described herein.

Thus, embodiments of the invention can be used to reduce or eliminate undesired audio from acoustic systems that process and deliver desired audio. Some non-limiting examples of systems are, but are not limited to, use in short boom headsets, such as an audio headset for telephony suitable for enterprise call centers, industrial and general mobile usage, an in-line "ear buds" headset with an input line (wire, cable, or other connector), mounted on or within the frame of eyeglasses, a near-to-eye (NTE) headset display or headset computing device, a long boom headset for very noisy environments such as industrial, military, and aviation applications as well as a gooseneck desktop-style microphone which can be used to provide theater or symphony-hall type quality acoustics without the structural costs.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

In the appended claims, use of the phrase "means for" is intentionally used to invoke the "means-plus-function" language codified historically in 35 U.S.C. 112§ paragraph 6 (pre AIA) and now presently codified in 35 U.S.C. § 112(f). If the phrase "means for" is not found in a claim of the appended claims then it is intentionally absent from that claim and that claim should not be interpreted under 35 U.S.C. § 112(f).

What is claimed is:

1. A non-transitory computer readable medium containing executable computer program instructions, which when executed by an acoustic signal processing system, cause the acoustic signal processing system to perform a process comprising: calculating a long-term power level of a main acoustic signal to obtain an averaged main acoustic signal, wherein segments of the main acoustic signal are excluded from the averaged main acoustic signal using a desired voice activity detection signal; calculating a long-term power level of a reference acoustic signal to obtain an averaged reference acoustic signal wherein segments of the reference acoustic signal are excluded from the averaged reference acoustic signal using the desired voice activity detection signal; and creating an amplitude correction signal using the averaged main acoustic signal and the averaged reference acoustic signal, wherein the amplitude correction signal is used, to adjust either the main acoustic signal or the reference acoustic signal to automatically balance acoustic channel sensitivity.

2. The computer readable medium of claim 1, wherein excluded segments of the main acoustic signal contain desired audio, and excluded segments of the reference acoustic signal contain desired audio.

3. The computer readable medium of claim 1, wherein the creating normalizes the averaged main acoustic signal by the averaged reference acoustic signal and the process further comprising:
 correcting the reference acoustic signal with the amplitude correction signal.

4. The computer readable medium of claim 3, wherein the correcting multiplies the amplitude correction signal by the reference signal.

5. The computer readable medium of claim 1, wherein the creating normalizes the averaged reference acoustic signal by the averaged main acoustic signal and the process further comprising:
 correcting the main acoustic signal with the amplitude correction signal.

6. The computer readable medium of claim 5, wherein the correcting multiplies the amplitude correction signal by the main acoustic signal.

7. The computer readable medium of claim 1, the process further comprising:
 filtering the main acoustic signal with a voice band filter before the calculating the long-term power level of the main acoustic signal; and
 filtering the reference acoustic signal with a voice band filter before the calculating the long-term power level of the reference acoustic signal.

8. The computer readable medium of claim 1, the process further comprising:
 calculating a long-term power level of a second reference acoustic signal to obtain an averaged second reference acoustic signal, wherein segments of the second reference acoustic signal are excluded from the averaged second reference acoustic signal using the desired voice activity detection signal; and
 creating a second amplitude correction signal using the averaged main acoustic signal and the averaged second reference acoustic signal.

9. The computer readable medium of claim 8, wherein the creating the second amplitude correction signal normalizes the averaged main acoustic signal by the averaged second reference acoustic signal and the process further comprising:
 correcting the second reference acoustic signal with the second amplitude correction signal.

10. The computer readable medium of claim 9, wherein the correcting multiplies the second amplitude correction signal by the second reference acoustic signal.

11. The computer readable medium of claim 1, wherein a duration of an averaging time ranges from a fraction of a second to minutes.

12. An integrated circuit device to automatically balance acoustic channel sensitivity, comprising:
 a first signal path, the first signal path is configured to receive and average acoustic signals from a first microphone channel to produce a long-term running average power level of the first microphone channel, exclusive of segments containing desired audio;
 a second signal path, the second signal path is configured to receive and average acoustic signals from a second microphone channel to produce a long-term running average power level of the second microphone channel, exclusive of segments containing desired audio;
 a first normalizer, the first signal path is coupled to a first input into the first normalizer and the second signal path is coupled to a second input into the first normalizer, the first normalizer is configured to normalize a signal on the first input by a signal on the second input to output an amplitude correction signal; and
 a first multiplier, the first multiplier is coupled to the second signal path and to an output of the first normalizer, the first multiplier is configured to multiply the amplitude correction signal by acoustic signals on the second microphone channel to produce a corrected second microphone signal.

13. The integrated circuit device of claim 12 further comprising:
 a first voice band filter, the first voice band filter is part of the first signal path and acoustic signals from the first microphone channel are filtered before the long-term running average power level is calculated; and
 a second voice band filter, the second voice band filter is part of the second signal path and acoustic signals from the second microphone channel are filtered before the long-term running average power level is calculated.

14. The integrated circuit device of claim 12, wherein a long-term running average is performed over an interval that can range from a fraction of a second to minutes.

15. The integrated circuit device of claim 12, further comprising:
 a third signal path, the third signal path is configured to receive and average acoustic signals from a third microphone channel to produce a long-term running average power level of the third microphone channel, exclusive of segments containing desired audio;
 a second normalizer, the first signal path is coupled to a first input into the second normalizer and the third signal path is coupled to a second input into the second normalizer, the second normalizer is configured to normalize a signal on the first input by a signal on the second input to output a second amplitude correction signal; and
 a second multiplier, the second multiplier is coupled to the third signal path and to an output of the second normalizer, the second multiplier is configured to multiply the second amplitude correction signal by acoustic signals on the third microphone channel to produce a corrected third microphone signal.

16. The integrated circuit device of claim 15, further comprising:
a beamformer, the corrected second microphone signal and the corrected third microphone signal are input to the beamformer.

17. The integrated circuit device of claim 12, further comprising:
a beamformer, the corrected second microphone signal is input to the beamformer.

18. The integrated circuit device of claim 12, wherein the integrated circuit device is configured into a device worn by a user.

19. An integrated circuit device to automatically balance acoustic channel sensitivity, comprising:
a first signal path, the first signal path is configured to receive and average acoustic signals from a first microphone channel to produce a long-term running average power level of the first microphone channel, exclusive of segments containing desired audio;
a second signal path, the second signal path is configured to receive and average acoustic signals from a second microphone channel to produce a long-term running average power level of the second microphone channel, exclusive of segments containing desired audio;
a first divider, the first signal path is coupled to a first input into the first divider and the second signal path is coupled to a second input into the first divider, the first divider is configured to divide a signal on the first input by a signal on the second input to output an amplitude correction signal; and
a first multiplier, the first multiplier is coupled to the second signal path and to an output of the first divider, the first multiplier is configured to multiply the amplitude correction signal by acoustic signals on the second microphone channel to produce a corrected second microphone signal.

20. The integrated circuit device of claim 19 further comprising:
a first voice band filter, the first voice band filter is part of the first signal path and acoustic signals from the first microphone channel are filtered before the long-term running average power level is calculated; and
a second voice band filter, the second voice band filter is part of the second signal path and acoustic signals from the second microphone channel are filtered before the long-term running average power level is calculated.

21. The integrated circuit device of claim 19, wherein a long-term running average is performed over an interval that can range from a fraction of a second to minutes.

22. The integrated circuit device of claim 19, further comprising:
a third signal path, the third signal path is configured to receive and average acoustic signals from a third microphone channel to produce a long-term running average power level of the third microphone channel, exclusive of segments containing desired audio;
a second divider, the first signal path is coupled to a first input into the second divider and the third signal path is coupled to a second input into the second divider, the second divider is configured to divide a signal on the first input by a signal on the second input to output a second amplitude correction signal; and
a second multiplier, the second multiplier is coupled to the third signal path and to an output of the second divider, the second multiplier is configured to multiply the second amplitude correction signal by acoustic signals on the third microphone channel to produce a corrected third microphone signal.

23. The integrated circuit device of claim 22, further comprising:
a beamformer, the corrected second microphone signal and the corrected third microphone signal are input to the beamformer.

24. The integrated circuit device of claim 19, further comprising:
a beamformer, the corrected second microphone signal is an input to the beamformer.

25. The integrated circuit device of claim 19, wherein the integrated circuit device is configured into a device worn by a user.

26. An integrated circuit device to automatically balance acoustic channel sensitivity, comprising:
means for calculating a long-term power level of a main acoustic signal to obtain an averaged main acoustic signal, wherein segments of the main acoustic signal are excluded from the averaged main acoustic signal using a desired voice activity detection signal;
means for calculating a long-term power level of a reference acoustic signal to obtain an averaged reference acoustic signal, wherein segments of the reference acoustic signal are excluded from the averaged reference acoustic signal using the desired voice activity detection signal; and
means for creating an amplitude correction signal using the averaged main acoustic signal and the averaged reference acoustic signal, wherein the amplitude correction signal is used to adjust either the main acoustic signal or the reference acoustic signal to automatically balance acoustic channel sensitivity.

27. The integrated circuit device of claim 26 further comprising:
means for correcting the main acoustic signal with the amplitude correction signal.

28. The integrated circuit device of claim 26, further comprising:
means for filtering the main acoustic signal with a voice band filter before calculating the long-term power level of the main acoustic signal; and
means for filtering the reference acoustic signal with a voice band filter before calculating the long-term power level of the reference acoustic signal.

29. The integrated circuit device of claim 26, further comprising:
means for calculating a long-term power level of a second reference acoustic signal to obtain an averaged second reference acoustic signal, wherein segments of the second reference acoustic signal are excluded from the averaged second reference acoustic signal using the desired voice activity detection signal; and
means for creating a second amplitude correction signal using the averaged main acoustic signal and the averaged second reference acoustic signal.

30. The integrated circuit device of claim 29, wherein creating the second amplitude correction signal normalizes the averaged main acoustic signal by the averaged second reference acoustic signal and the integrated circuit device further comprising:
means for correcting the second reference acoustic signal with the second amplitude correction signal.

* * * * *